United States Patent
Cho et al.

(10) Patent No.: US 12,495,609 B2
(45) Date of Patent: Dec. 9, 2025

(54) ORGANIC LIGHT EMITTING DISPLAY DEVICE

(71) Applicant: Samsung Display Co., Ltd., Yongin-si (KR)

(72) Inventors: Seung-Hwan Cho, Yongin-si (KR); Jong-Hyun Choi, Seoul (KR); Ju-Chan Park, Seoul (KR); Joo-Sun Yoon, Seoul (KR); Jung-Kyu Lee, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 1253 days.

(21) Appl. No.: 17/262,624

(22) PCT Filed: Jun. 25, 2019

(86) PCT No.: PCT/KR2019/007680
§ 371 (c)(1),
(2) Date: Jan. 22, 2021

(87) PCT Pub. No.: WO2020/022657
PCT Pub. Date: Jan. 30, 2020

(65) Prior Publication Data
US 2021/0359058 A1   Nov. 18, 2021

(30) Foreign Application Priority Data
Jul. 25, 2018   (KR) .......................... 10-2018-0086679

(51) Int. Cl.
*H10D 86/01*   (2025.01)
*H10K 59/121*   (2023.01)
(Continued)

(52) U.S. Cl.
CPC ..... *H10D 86/0221* (2025.01); *H10K 59/1213* (2023.02); *H10D 86/421* (2025.01); *H10D 86/60* (2025.01)

(58) Field of Classification Search
CPC ................ H10K 59/1213; H10K 50/80; H01L 27/1222; H01L 27/1218; H10D 86/0221; (Continued)

(56) References Cited

U.S. PATENT DOCUMENTS

| | | |
|---|---|---|
| 9,437,617 B2 | 9/2016 | Lee et al. |
| 10,347,772 B2 | 7/2019 | Kim |

(Continued)

FOREIGN PATENT DOCUMENTS

| | | |
|---|---|---|
| KR | 10-1295877 B1 | 8/2013 |
| KR | 10-2015-0010523 A | 1/2015 |

(Continued)

OTHER PUBLICATIONS

International Search Report for corresponding Application No. PCT/KR2019/007680 mailed Oct. 1, 2019, 5pp.

*Primary Examiner* — Ratisha Mehta
(74) *Attorney, Agent, or Firm* — Womble Bond Dickinson (US) LLP

(57) ABSTRACT

An organic light emitting display device includes: a substrate having a sub-pixel circuit region including a driving transistor region; an active pattern in the sub-pixel circuit region on the substrate, and including a bent portion having a first length in the driving transistor region, and a straight portion adjacent to the bent portion in the driving transistor region and having a second length shorter than the first length in the driving transistor region; and a sub-pixel structure on the active pattern. Accordingly, when the organic light emitting display device is driven at a low gray level, the organic light emitting display device can improve (Continued)

the low gray-level spot and the crosstalk while relatively reducing the power consumption.

19 Claims, 16 Drawing Sheets

(51) Int. Cl.
 *H10D 86/40* (2025.01)
 *H10D 86/60* (2025.01)
(58) Field of Classification Search
 CPC .. H10D 86/421; H10D 86/60; H10D 30/6757; H10D 86/441; H10D 86/411
 See application file for complete search history.

(56) References Cited

U.S. PATENT DOCUMENTS

| | | | |
|---|---|---|---|
| 10,396,139 B2 | 8/2019 | Yoon et al. | |
| 2012/0175627 A1 | 7/2012 | Sun et al. | |
| 2015/0021561 A1 | 1/2015 | Jeon | |
| 2015/0115256 A1* | 4/2015 | You | H01L 27/1255 257/40 |
| 2015/0380567 A1 | 12/2015 | Han et al. | |
| 2016/0190173 A1 | 6/2016 | Lee et al. | |
| 2016/0210905 A1 | 7/2016 | Lee et al. | |
| 2016/0233281 A1* | 8/2016 | Yoon | H01L 27/124 |
| 2016/0254340 A1* | 9/2016 | Kwon | H10K 59/124 257/40 |
| 2016/0321997 A1 | 11/2016 | Jeong et al. | |
| 2017/0278917 A1 | 9/2017 | Kim | |
| 2017/0358605 A1* | 12/2017 | Choi | H01L 27/1255 |
| 2020/0027944 A1* | 1/2020 | Xuan | H01L 27/156 |
| 2020/0203391 A1* | 6/2020 | Liu | H01L 21/02244 |
| 2023/0123708 A1 | 4/2023 | Kim et al. | |

FOREIGN PATENT DOCUMENTS

| | | |
|---|---|---|
| KR | 10-1486038 B1 | 1/2015 |
| KR | 10-2015-0057661 A | 5/2015 |
| KR | 10-2015-0085385 A | 7/2015 |
| KR | 10-2016-0007982 A | 1/2016 |
| KR | 10-2016-0082866 A | 7/2016 |
| KR | 10-2016-0089939 A | 7/2016 |
| KR | 10-2016-0090949 A | 8/2016 |
| KR | 10-2016-0098650 A | 8/2016 |
| KR | 10-2017-0046198 A | 5/2017 |
| KR | 10-2017-0080147 A | 7/2017 |
| KR | 10-2017-0113865 A | 10/2017 |

\* cited by examiner

FIG. 3
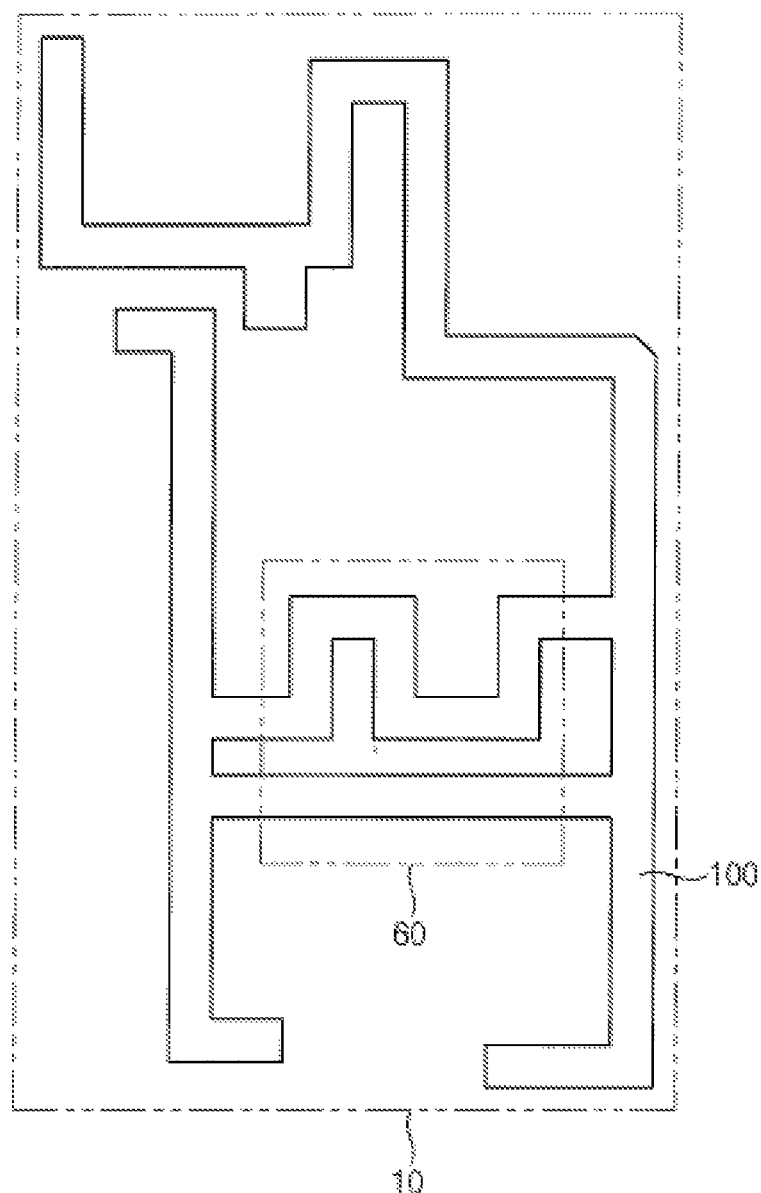
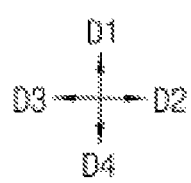

FIG. 4
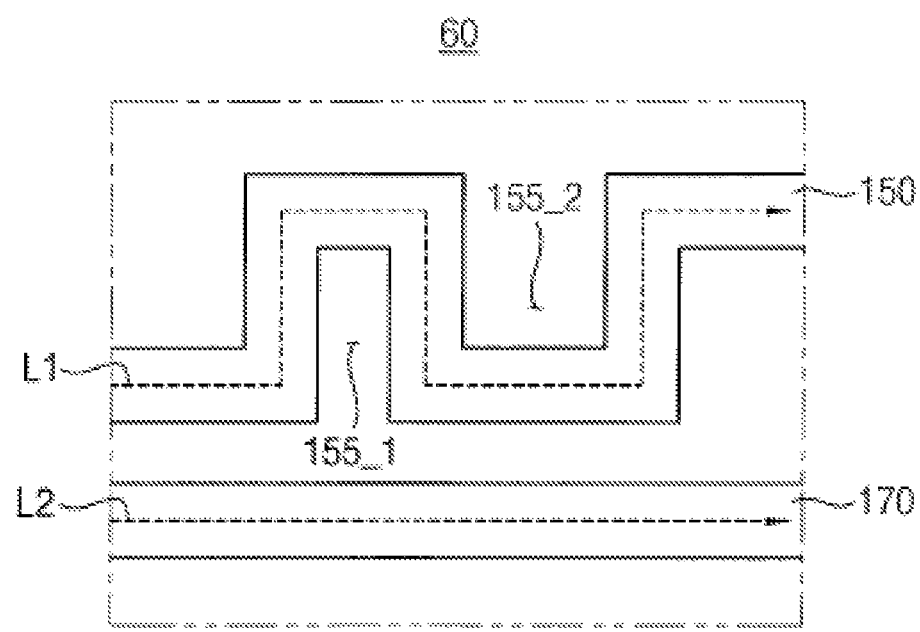
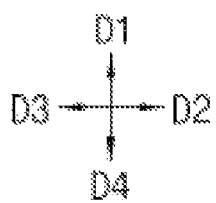

FIG. 5
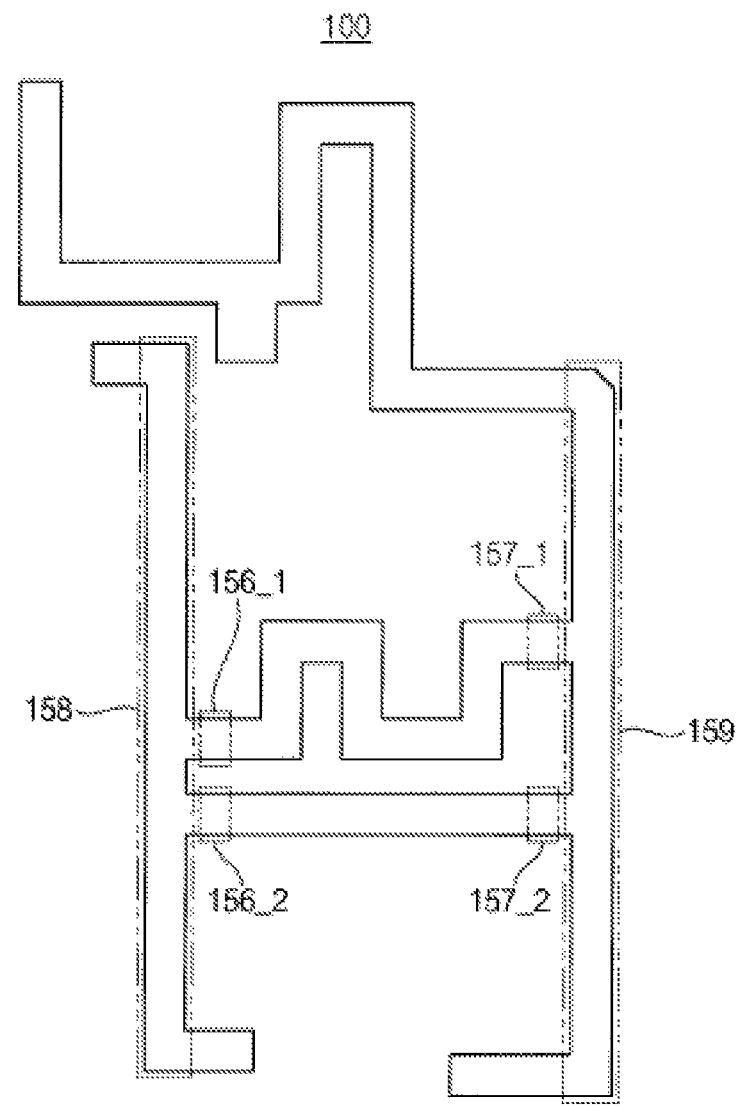
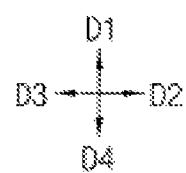

ORGANIC LIGHT EMITTING DISPLAY DEVICE

CROSS-REFERENCE TO RELATED APPLICATIONS

This application is a National Phase Patent Application and claims priority to and the benefit of International Application Number PCT/KR2019/007680, filed on Jun. 25, 2019, which claims priority to Korean Patent Application Number 10-2018-0086679, filed on Jul. 25, 2018, the entire contents of all each of which are incorporated herein by reference.

TECHNICAL FIELD

Embodiments relate generally to an organic light emitting display device. More particularly, embodiments of the present inventive concept relate to an organic light emitting display device including sub-pixels.

BACKGROUND

Flat panel display devices are used as display devices for replacing a cathode ray tube display device due to lightweight and thin characteristics thereof. As representative examples of such flat panel display devices, there are liquid crystal display devices and organic light emitting display devices. Among the above display devices, when compared to the liquid crystal display device, the organic light emitting display device has excellent luminance characteristics and excellent viewing angle characteristics, and does not require a backlight unit so that the organic light emitting display device may be implemented in an ultra-thin type. The organic light emitting display device is configured such that electrons and holes injected into an organic thin film through a negative electrode and a positive electrode are recombined to form excitons, and light having a specific wavelength is generated by energy from the formed excitons.

The organic light emitting display device may include a plurality of sub-pixels. One driving transistor may be located in each of the sub-pixels, and the driving transistor may have a driving range to express gray levels. In this case, when the organic light emitting display device is configured such that the driving range of the driving transistor is increased in order to improve a low gray-level spot (mura) and crosstalk, power consumption may be increased.

CONTENT OF THE INVENTION

Problem to be Solved

An object of the present invention is to provide an organic light emitting display device including sub-pixels.

However, the object of the present inventive concept is not limited thereto. Thus, the object of the present inventive concept may be extended without departing from the spirit and the scope of the present inventive concept.

Means for Solving the Problem

In order to achieve the object of the present invention described above, an organic light emitting display device includes a substrate, an active pattern, and a sub-pixel structure. The substrate has a sub-pixel circuit region including a driving transistor region. The active pattern is located in the sub-pixel circuit region on the substrate, and includes a bent portion and a straight portion. The bent portion has a first length in the driving transistor region. The straight portion is adjacent to the bent portion in the driving transistor region, and has a second length shorter than the first length in the driving transistor region. The sub-pixel structure is located on the active pattern.

In embodiments, the organic light emitting display device may further include a gate electrode located in the driving transistor region on the substrate.

In embodiments, the organic light emitting display device may further include first and second driving transistors located in the driving transistor region on the substrate, and the first and second driving transistors are connected to each other in parallel. The gate electrode may constitute the first driving transistor together with the bent portion of the active pattern, and the gate electrode may constitute the second driving transistor together with the straight portion of the active pattern.

In embodiments, the bent portion of the active pattern may correspond to a channel of the first driving transistor, and the straight portion of the active pattern may correspond to a channel of the second driving transistor.

In embodiments, the active pattern may include poly silicon.

In embodiments, the straight portion may be doped with phosphorous (P) or boron (B).

In embodiments, the straight portion may include source and drain regions and a channel region located between the source and drain regions, and the channel region of the straight portion is doped with phosphorus (P) or boron (B).

In embodiments, wherein the straight portion of the active pattern may include a first straight portion and a second straight portion. The first straight portion may be entirely doped with phosphorus (P) or boron (B). The second straight portion may be spaced apart from the first straight portion, and may be at least partially doped with the phosphorus (P) or the boron (B).

In embodiments, the organic light emitting display device may further include a gate electrode and first, second, and third driving transistors. The gate electrode may be located in the driving transistor region on the substrate. The first, second, and third driving transistors may be located in the driving transistor region on the substrate, and may be connected to each other in parallel. The gate electrode may constitute the first driving transistor together with the bent portion of the active pattern. The gate electrode may constitute the second driving transistor together with the first straight portion of the active pattern. The gate electrode may constitute the third driving transistor together with the second straight portion of the active pattern.

In embodiments, the bent portion of the active pattern may correspond to a channel of the first driving transistor. The first straight portion of the active pattern may correspond to a channel of the second driving transistor. The doped portion of the second straight portion of the active pattern may correspond to a channel of the third driving transistor.

In embodiments, a length of the channel of the third driving transistor may be shorter than a length of the channel of the second driving transistor.

In embodiments, at least one recess may be formed in a planar direction by the bent portion.

In embodiments, the sub-pixel circuit region may further include a switching transistor region surrounding the driving transistor region.

In embodiments, the active pattern may further include a first extension portion, a first protrusion portion, and a second protrusion portion. The first extension portion may be located in the switching transistor region on the substrate, and may be spaced apart from the bent portion and the straight portion. The first extension portion may extend in a first direction. The first protrusion portion may protrude from the first extension portion in a second direction orthogonal to the first direction, and may be connected to a first end of the bent portion. The second protrusion portion may be spaced apart from the first protrusion portion, and may protrude from the first extension portion in the second direction. The second protrusion portion may be connected to a first end of the straight portion. The first extension portion, the first protrusion portion, the second protrusion portion, the first end of the bent portion, and the first end of the straight portion may be integrally formed.

In embodiments, the active pattern may further include a second extension portion, a third protrusion portion, and a fourth protrusion portion. The second extension portion may be spaced apart from the bent portion and the straight portion in the second direction in the switching transistor region, and may extend in the first direction. The third protrusion portion may protrude from the second extension portion in a third direction opposite to the second direction, and may be connected to a second end of the bent portion opposite to the first end of the bent portion. The fourth protrusion portion may be spaced apart from the third protrusion portion, and may protrude from the second extension portion in the third direction. The fourth protrusion portion may be connected to a second end of the straight portion opposite to the first end of the straight portion. The second extension portion, the third protrusion portion, the fourth protrusion portion, the second end of the bent portion, and the second end of the straight portion may be integrally formed.

In embodiments, the active pattern may further include a first extension portion and a first protrusion portion. The first extension portion may be located in the switching transistor region on the substrate, and may be spaced apart from the bent portion and the straight portion. The first extension portion may extend in a first direction. The first protrusion portion may protrude from the first extension portion in a second direction orthogonal to the first direction, and may be connected to a first end of the bent portion and a first end of the straight portion. The first extension portion, the first protrusion portion, the first end of the bent portion, and the first end of the straight portion may be integrally formed.

In embodiments, the active pattern may further include a second extension portion, a second protrusion portion, and a third protrusion portion. The second extension portion may be spaced apart from the bent portion and the straight portion in the second direction in the switching transistor region, and may extend in the first direction. The second protrusion portion may protrude from the second extension portion in a third direction opposite to the second direction, and may be connected to a second end of the bent portion opposite to the first end of the bent portion. The third protrusion portion may be spaced apart from the second protrusion portion, and may protrude from the second extension portion in the third direction. The third protrusion portion may be connected to a second end of the straight portion opposite to the first end of the straight portion. The second extension portion, the second protrusion portion, the third protrusion portion, the second end of the bent portion, and the second end of the straight portion may be integrally formed.

In embodiments, the organic light emitting display device may further include a first gate wire. The first gate wire may be located in the switching transistor region on the substrate, and may extend in a second direction on a first extension portion and a second extension portion of the active pattern.

In embodiments, a first switching transistor may be configured at a portion where the first gate wire intersects the first extension portion and a second switching transistor may be configured at a portion where the first gate wire intersects the second extension portion.

In embodiments, the sub-pixel structure may include a lower electrode located on the active pattern, a light emitting layer located on the lower electrode, and an upper electrode located on the light emitting layer.

Effects of the Invention

Because the organic light emitting display device according to the embodiments of the present invention includes the first driving transistor and the second driving transistor that are connected to each other in parallel and have mutually different channel lengths, when the organic light emitting display device is driven at a low gray level, the organic light emitting display device can improve the low gray-level spot and the crosstalk while relatively reducing the power consumption.

However, the effect of the present inventive concept is not limited thereto. Thus, the effect of the present inventive concept may be extended without departing from the spirit and the scope of the present inventive concept.

BRIEF DESCRIPTION OF THE DRAWINGS

FIG. 3 is a layout view for describing a sub-pixel circuit region of a substrate included in the organic light emitting display device of FIG. 1.

FIG. 4 is a layout view for describing active patterns located in a driving transistor region of FIG. 3.

FIG. 5 is a layout view for describing the active pattern of FIG. 3.

PARTICULAR CONTENTS FOR IMPLEMENTING THE INVENTION

Figure 1:
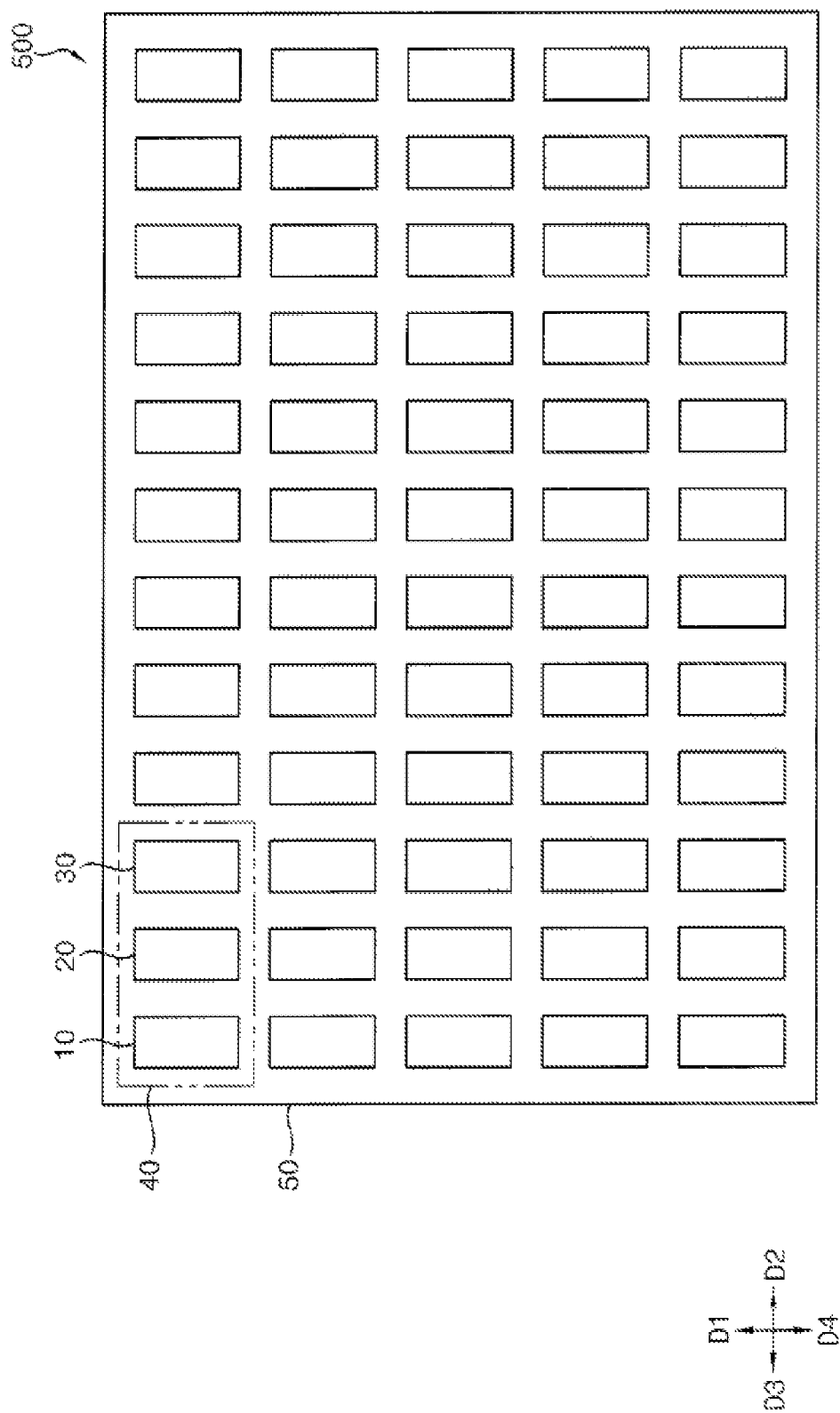
FIG. 1 is a plan view showing an organic light emitting display device according to embodiments of the present invention.

Hereinafter, an organic light emitting display device according to embodiments of the present invention will be described in detail with reference to the accompanying drawings. In the accompanying drawings, same or similar reference numerals refer to the same or similar elements.

FIG. 1 is a plan view showing an organic light emitting display device according to embodiments of the present invention.

Referring to FIG. 1, an organic light emitting display device 500 may include a substrate 50, and the substrate 50 may include a plurality of pixel circuit regions 40. In this case, the pixel circuit regions 40 may be arranged over the whole substrate 50 in a first direction D1 parallel to a top surface of the substrate 50 and a second direction D2 orthogonal to the first direction D1. In addition, each of the pixel circuit regions 40 may include first, second, and third sub-pixel circuit regions 10, 20, and 30, and three sub-pixel circuit regions may be defined as one pixel circuit region 40.

Although one pixel circuit region 40 according to the present invention has been described as including three sub-pixel circuit regions, the configuration of the present invention is not limited thereto, and the one pixel circuit region 40 may include two sub-pixel circuit regions or at least four sub-pixel circuit regions.

First, second, and third sub-pixel circuits may be located in the first to third sub-pixel circuit regions 10, 20, and 30, respectively. For example, the first sub-pixel circuit located in the first sub-pixel circuit region 10 may be connected to a first sub-pixel structure for emitting red light, the second sub-pixel circuit located in the second sub-pixel circuit region 20 may be connected to a second sub-pixel structure for emitting green light, and the third sub-pixel circuit located in the third sub-pixel circuit region 30 may be connected to a third sub-pixel structure for emitting blue light. In addition, wires may be located in the first to third sub-pixel circuit regions 10, 20, and 30 on the substrate 50. For example, the wires may include data signal wires, scan signal wires, emission signal wires, initialization signal wires, power supply voltage wires, and the like. In other words, the organic light emitting display device 500 may include a plurality of sub-pixel circuits, a plurality of sub-pixel structures, a plurality of wires, and the like.

In embodiments, the first sub-pixel structure may overlap the first sub-pixel circuit region 10, the second sub-pixel structure may overlap the second sub-pixel circuit region 20, and the third sub-pixel structure may overlap the third sub-pixel circuit region 30. In some embodiments, the first sub-pixel structure may overlap a part of the first sub-pixel circuit region 10 and a part of a sub-pixel circuit region other than the first sub-pixel circuit region 10, the second sub-pixel structure may overlap a part of the second sub-pixel circuit region 20 and a part of a sub-pixel circuit region other than the second sub-pixel circuit region 20, and the third sub-pixel structure may overlap a part of the third sub-pixel circuit region 30 and a part of a sub-pixel circuit region other than the third sub-pixel circuit region 30.

For example, the first to third sub-pixel structures may be arranged by using an RGB stripe scheme in which rectangles having the same size are sequentially arranged, an S-stripe scheme including a blue sub-pixel structure having a relatively large area, a WRGB scheme further including a white sub-pixel structure, a PenTile scheme in which RG-GB patterns are repeatedly arranged, or the like.

In addition, at least one driving transistor, at least one switching transistor, and at least one capacitor may be located in each of the first to third sub-pixel circuit regions 10, 20, and 30. In the embodiments, two driving transistors connected to each other in parallel, eight switching transistors, and one storage capacitor may be located in each of the first to third sub-pixel circuit regions 10, 20, and 30.

Although each of the first to third sub-pixel circuit regions 10, 20, and 30 and the pixel circuit region 40 according to the present invention has been described as having a rectangular shape when viewed in a plan view, the shape is not limited thereto. For example, each of the first to third sub-pixel circuit regions 10, 20, and 30 and the pixel circuit region 40 may have a triangular shape, a rhombic shape, a polygonal shape, a circular shape, a track shape, or an elliptical shape when viewed in a plan view.

Figure 2:
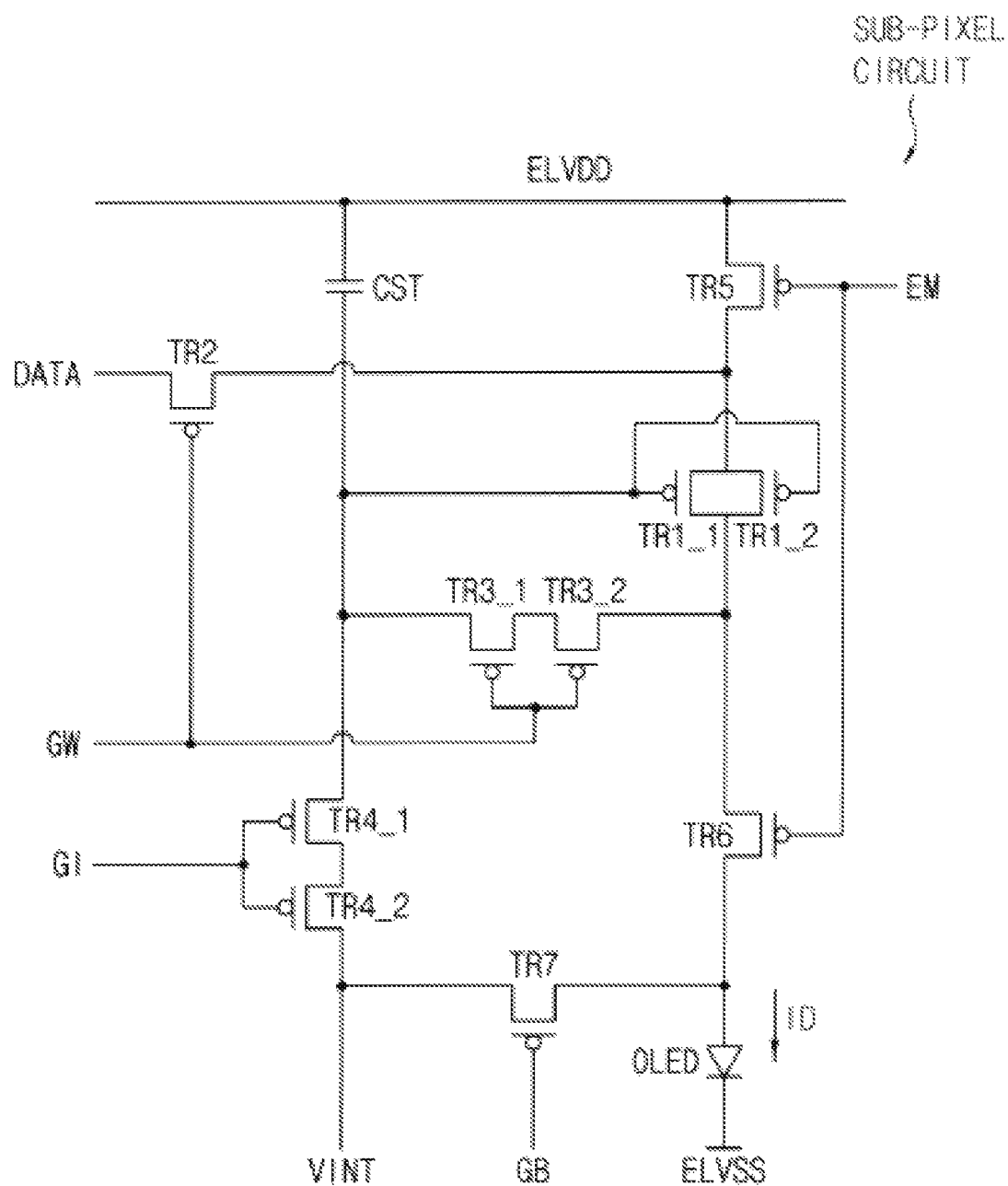
FIG. 2 is a circuit diagram showing a sub-pixel circuit and an organic light emitting diode located in a sub-pixel circuit region of FIG. 1.

FIG. 2 is a circuit diagram showing a sub-pixel circuit and an organic light emitting diode located in a sub-pixel circuit region of FIG. 1.

Referring to FIG. 2, a sub-pixel circuit SUB-PIXEL CIRCUIT, wires, and an organic light emitting diode OLED (e.g., a sub-pixel structure) may be located in each of the first to third sub-pixel circuit regions 10, 20, and 30 of the organic light emitting display device 500. In this case, the sub-pixel circuit SUB-PIXEL CIRCUIT may include first to seventh transistors TR1_1, TR1_2, TR2, TR3_1, TR3_2, TR4_1, TR4_2, TR5, TR6, and TR7, a storage capacitor CST, and the like, and the wires may include a high power supply voltage (ELVDD) wire, a low power supply voltage (ELVSS) wire, an initialization voltage (VINT) wire, a data signal (DATA) wire, a scan signal (GW) wire, a data initialization signal (GI) wire, an emission control signal (EM) wire, a diode initialization signal (GB) wire, and the like. In this case, the first transistors TR1_1 and TR1_2 may correspond to driving transistors, and the second to seventh transistors TR2, TR3_1, TR3_2, TR4_1, TR4_2, TR5, TR6, and TR7 may correspond to switching transistors. In addition, the sub-pixel circuit SUB-PIXEL CIRCUIT may further include an active pattern (e.g., an active pattern 100 of FIG. 3) configured to connect the first to seventh transistors TR1_1, TR1_2, TR2, TR3_1, TR3_2, TR4_1, TR4_2, TR5, TR6, and TR7 to the storage capacitor CST.

The organic light emitting diode OLED (e.g., corresponding to a sub-pixel structure 200 of FIG. 11) may output light based on a driving current ID. The organic light emitting diode OLED may include a first terminal and a second terminal. In the embodiments, the second terminal of the organic light emitting diode OLED may receive a low power supply voltage ELVSS. For example, the first terminal of the organic light emitting diode OLED may be an anode terminal, and the second terminal of the organic light emitting diode OLED may be a cathode terminal. In some embodiments, the first terminal of the organic light emitting diode OLED may be a cathode terminal, and the second terminal of the organic light emitting diode OLED may be an anode terminal. In the embodiments, the anode terminal of the organic light emitting diode OLED may correspond to a lower electrode 291 of FIG. 11, and the cathode terminal of the organic light emitting diode OLED may correspond to an upper electrode 340 of FIG. 11.

Figure 11:
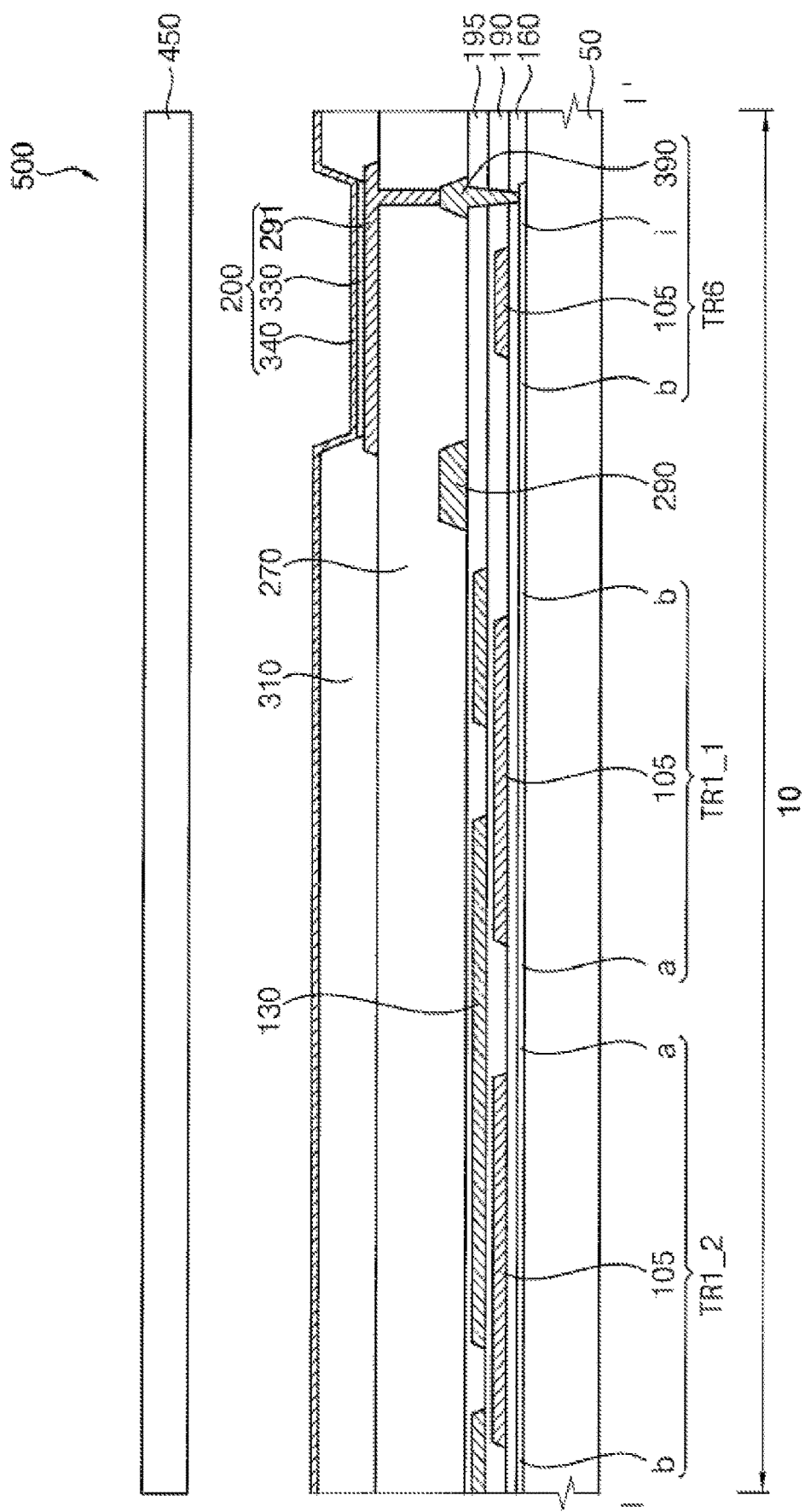
FIG. 11 is a sectional view taken along line I-I' of the organic light emitting display device of FIG. 10.

Each of the first transistors TR1_1 and TR1_2 (e.g., corresponding to first transistors TR1_1 and TR1_2 shown in FIG. 11) may include a gate terminal, a first terminal, and a second terminal. In this case, the first transistor TR1_1

(hereinafter referred to as "first driving transistor TR1_1") and the first transistor TR1_2 (hereinafter referred to as "second driving transistor TR1_2") may correspond to driving transistors, and may be connected to each other in parallel. For example, the first driving transistor TR1_1 and the second driving transistor TR1_2 may have the same gate terminal (e.g., corresponding to a first gate electrode 105 of FIG. 6), the same first terminal (e.g., corresponding to a first region of FIG. 6), and the same second terminal (e.g., corresponding to a second region of FIG. 6). In the embodiments, a length of a channel of the first driving transistor TR1_1 (e.g., corresponding to a first length L1 of FIG. 4) may be longer than a length of a channel of the second driving transistor TR1_2 (e.g., corresponding to a second length L2 of FIG. 4). In addition, the first terminal of the first and second driving transistors TR1_1 and TR1_2 may be a source terminal, and the second terminal of the first and second driving transistors TR1_1 and TR1_2 may be a drain terminal. In some embodiments, the first terminal of the first and second driving transistors TR1_1 and TR1_2 may be a drain terminal, and the second terminal of the first and second driving transistors TR1_1 and TR1_2 may be a source terminal.

The first and second driving transistors TR1_1 and TR1_2 may generate a driving current ID. In the embodiments, the first and second driving transistors TR1_1 and TR1_2 may operate in a saturation region. In this case, the first and second driving transistors TR1_1 and TR1_2 may generate the driving current ID based on a voltage difference between the gate terminal and the source terminal. In addition, gray levels may be expressed based on a magnitude of the driving current ID supplied to the organic light emitting diode OLED. In some embodiments, the first and second driving transistors TR1_1 and TR1_2 may operate in a linear region. In this case, the gray levels may be expressed based on the sum of a time during which the driving current is supplied to the organic light emitting diode OLED within one frame.

The second transistor TR2 may include a gate terminal, a first terminal, and a second terminal. The gate terminal of the second transistor TR2 may receive a scan signal GW from the scan signal (GW) wire (corresponding to a first gate wire 110 of FIG. 6). The first terminal of the second transistor TR2 may receive a data signal DATA from the data signal (DATA) wire (e.g., corresponding to a data wire 191 of FIG. 8). The second terminal of the second transistor TR2 may be connected to the first terminal of each of the first transistors TR1_1 and TR1_2. In the embodiments, the first terminal may be a source terminal, and the second terminal may be a drain terminal. In some embodiments, the first terminal may be a drain terminal, and the second terminal may be a source terminal.

The second transistor TR2 may supply the data signal DATA to the first terminal of the first and second driving transistors TR1_1 and TR1_2 during an activation period of the scan signal GW. In this case, the second transistor TR2 may operate in a linear region.

Each of the third transistors TR3_1 and TR3_2 may include a gate terminal, a first terminal, and a second terminal. In this case, the third transistor TR3_1 and the third transistor TR3_2 may be connected to each other in series, and may operate as a dual transistor. For example, when the dual transistor is turned off, a leakage current may be reduced. The gate terminal of each of the third transistors TR3_1 and TR3_2 may receive a scan signal GW. The first terminal of each of the third transistors TR3_1 and TR3_2 may be connected to the gate terminal of the first and second driving transistors TR1_1 and TR1_2. The second terminal of each of the third transistors TR3_1 and TR3_2 may be connected to the second terminal of the first and second driving transistors TR1_1 and TR1_2. In the embodiments, the first terminal of each of the third transistors TR3_1 and TR3_2 may be a source terminal, and the second terminal of each of the third transistors TR3_1 and TR3_2 may be a drain terminal. In some embodiments, the first terminal of each of the third transistors TR3_1 and TR3_2 may be a drain terminal, and the second terminal of each of the third transistors TR3_1 and TR3_2 may be a source terminal.

Each of the third transistors TR3_1 and TR3_2 may connect the gate terminal of the first and second driving transistors TR1_1 and TR1_2 to the second terminal of the first and second driving transistors TR1_1 and TR1_2 during the activation period of the scan signal GW. In this case, each of the third transistors TR3_1 and TR3_2 may operate in a linear region. In other words, each of the third transistors TR3_1 and TR3_2 may diode-connect the first and second driving transistors TR1_1 and TR1_2 during the activation period of the scan signal GW. Because the first and second driving transistors TR1_1 and TR1_2 are diode-connected, a voltage difference corresponding to threshold voltages of the first and second driving transistors TR1_1 and TR1_2 may be generated between the first terminal of the first and second driving transistors TR1_1 and TR1_2 and the gate terminal of the first and second driving transistors TR1_1 and TR1_2. As a result, a voltage obtained by adding the voltage difference (i.e., the threshold voltage) to a voltage of the data signal DATA supplied to the first terminal of the first and second driving transistors TR1_1 and TR1_2 during the activation period of the scan signal GW may be supplied to the gate terminal of the first and second driving transistors TR1_1 and TR1_2. In other words, the data signal DATA may be compensated for by the threshold voltages of the first and second driving transistors TR1_1 and TR1_2, and the compensated data signal DATA may be supplied to the gate terminal of the first and second driving transistors TR1_1 and TR1_2. As the threshold voltage compensation is performed, unevenness of the driving current caused by a deviation of the threshold voltages of the first and second driving transistors TR1_1 and TR1_2 may be solved.

Figure 8:
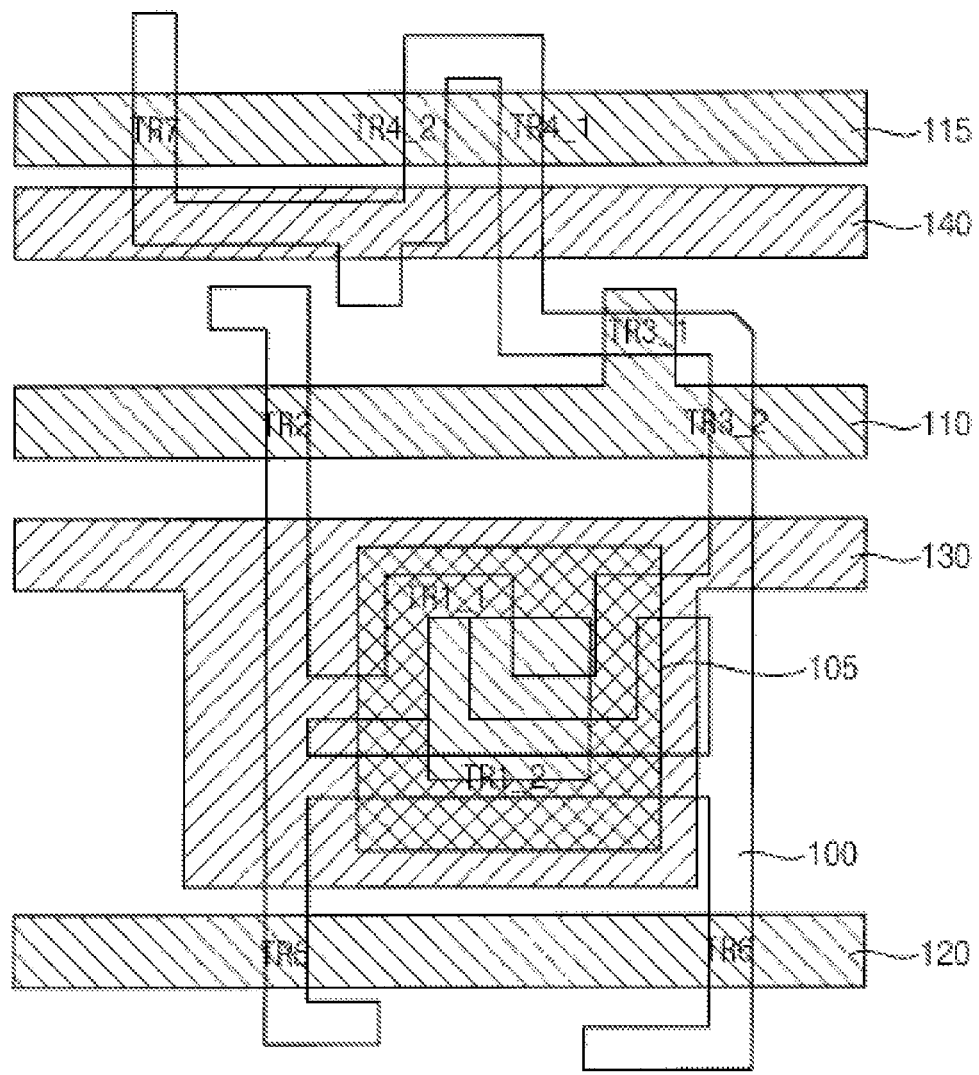

An input terminal of the initialization voltage (VINT) wire (e.g., corresponding to an initialization voltage wire 140 of FIG. 8) may be connected to a first terminal of each of the fourth transistors TR4_1 and TR4_2 and a first terminal of the seventh transistor TR7, and an output terminal of the initialization voltage (VINT) wire may be connected to a second terminal of each of the fourth transistors TR4_1 and TR4_2 and a first terminal of the storage capacitor CST.

Each of the fourth transistors TR4_1 and TR4_2 may include a gate terminal, a first terminal, and a second terminal. In this case, the fourth transistor TR4_1 and the fourth transistor TR4_2 may be connected to each other in series, and may operate as a dual transistor. For example, when the dual transistor is turned off, a leakage current may be reduced. The gate terminal of each of the fourth transistors TR4_1 and TR4_2 may receive a data initialization signal GI from the data initialization signal (GI) wire (e.g., corresponding to a second gate wire 115 of FIG. 6). The first terminal of each of the fourth transistors TR4_1 and TR4_2 may receive an initialization voltage VINT. The second terminal of each of the fourth transistors TR4_1 and TR4_2 may be connected to the gate terminal of the first and second driving transistors TR1_1 and TR1_2. In the embodiments, the first terminal of each of the fourth transistors TR4_1 and TR4_2 may be a source terminal, and the second terminal of each of the fourth transistors TR4_1 and TR4_2 may be a drain terminal. In some embodiments, the first terminal of each of the fourth transistors TR4_1 and TR4_2 may be a drain terminal, and the second terminal of each of the fourth transistors TR4_1 and TR4_2 may be a source terminal.

Each of the fourth transistors TR4_1 and TR4_2 may supply the initialization voltage VINT to the gate terminal of the first and second driving transistors TR1_1 and TR1_2 during an activation period of the data initialization signal GI. In this case, each of the fourth transistors TR4_1 and TR4_2 may operate in a linear region. In other words, each of the fourth transistors TR4_1 and TR4_2 may initialize the gate terminal of the first and second driving transistors TR1_1 and TR1_2 to the initialization voltage VINT during the activation period of the data initialization signal GI. In the embodiments, the initialization voltage VINT may have a voltage level sufficiently lower than a voltage level of the data signal DATA maintained by the storage capacitor CST in a previous frame, and the initialization voltage VINT may be supplied to the gate terminal of the first and second driving transistors TR1_1 and TR1_2 that are P-channel metal oxide semiconductor (PMOS) transistors. In other embodiments, the initialization voltage VINT may have a voltage level sufficiently higher than the voltage level of the data signal maintained by the storage capacitor in the previous frame, and the initialization voltage VINT may be supplied to the gate terminal of first and second driving transistors that are N-channel metal oxide semiconductor (NMOS) transistors.

In the embodiments, the data initialization signal GI may be substantially the same signal as the scan signal GW of one horizontal time before. For example, the data initialization signal GI supplied to sub-pixels in an $n^{th}$ row (where n is an integer greater than or equal to 2) among a plurality of sub-pixels included in the organic light emitting display device 500 may be substantially the same signal as the scan signal GW supplied to sub-pixels in an $(n-1)^{th}$ row among the sub-pixels. In other words, an activated data initialization signal GI may be supplied to the sub-pixels in the $n^{th}$ row among the sub-pixels by supplying an activated scan signal GW to the sub-pixels in the $(n-1)^{th}$ row among the sub-pixels. As a result, while the data signal DATA is supplied to the sub-pixels in the $(n-1)^{th}$ row among the sub-pixels, the gate terminal of the first and second driving transistors TR1_1 and TR1_2 included in the sub-pixels in the $n^{th}$ row among the sub-pixels may be initialized to the initialization voltage VINT.

The fifth transistor TR5 may include a gate terminal, a first terminal, and a second terminal. The gate terminal may receive an emission control signal EM from the emission control signal (EM) wire (e.g., a third gate wire 120 of FIG. 6). The first terminal may receive a high power supply voltage ELVDD from the high power supply voltage (ELVDD) wire (e.g., corresponding to a high power supply voltage wire 290 of FIG. 10). The second terminal may be connected to the first terminal of the first and second driving transistors TR1_1 and TR1_2. In the embodiments, the first terminal may be a source terminal, and the second terminal may be a drain terminal. In some embodiments, the first terminal may be a drain terminal, and the second terminal may be a source terminal.

The fifth transistor TR5 may supply the high power supply voltage ELVDD to the first terminal of the first and second driving transistors TR1_1 and TR1_2 during an activation period of the emission control signal EM. On the contrary, the fifth transistor TR5 may cut off the supply of the high power supply voltage ELVDD during an inactivation period of the emission control signal EM. In this case, the fifth transistor TR5 may operate in a linear region. Because the fifth transistor TR5 supplies the high power supply voltage ELVDD to the first terminal of the first and second driving transistors TR1_1 and TR1_2 during the activation period of the emission control signal EM, the first and second driving transistors TR1_1 and TR1_2 may generate the driving current ID. In addition, because the fifth transistor TR5 cuts off the supply of the high power supply voltage ELVDD during the inactivation period of the emission control signal EM, the data signal DATA supplied to the first terminal of the first and second driving transistors TR1_1 and TR1_2 may be supplied to the gate terminal of the first and second driving transistors TR1_1 and TR1_2.

The sixth transistor TR6 (e.g., corresponding to a sixth transistor TR6 shown in FIG. 11) may include a gate terminal, a first terminal, and a second terminal. The gate terminal may receive the emission control signal EM. The first terminal may be connected to the second terminal of the first and second driving transistors TR1_1 and TR1_2. The second terminal may be connected to the first terminal of the organic light emitting diode OLED. In the embodiments, the first terminal may be a source terminal, and the second terminal may be a drain terminal. In some embodiments, the first terminal may be a drain terminal, and the second terminal may be a source terminal.

The sixth transistor TR6 may supply the driving current ID generated by the first and second driving transistors TR1_1 and TR1_2 to the organic light emitting diode OLED during the activation period of the emission control signal EM. In this case, the sixth transistor TR6 may operate in a linear region. In other words, because the sixth transistor TR6 supplies the driving current ID generated by the first and second driving transistors TR1_1 and TR1_2 to the organic light emitting diode OLED during the activation period of the emission control signal EM, the organic light emitting diode OLED may output light. In addition, because the sixth transistor TR6 electrically separates the first and second driving transistors TR1_1 and TR1_2 from the organic light emitting diode OLED during the inactivation period of the emission control signal EM, the data signal DATA supplied to the second terminal of the first and second driving transistors TR1_1 and TR1_2 (precisely, the data signal that has been subject to the threshold voltage compensation) may be supplied to the gate terminal of the first and second driving transistors TR1_1 and TR1_2.

The seventh transistor TR7 may include a gate terminal, a first terminal, and a second terminal. The gate terminal may receive a diode initialization signal GB. The first terminal may receive the initialization voltage VINT. The second terminal may be connected to the first terminal of the organic light emitting diode OLED. In the embodiments, the first terminal may be a source terminal, and the second terminal may be a drain terminal. In some embodiments, the first terminal may be a drain terminal, and the second terminal may be a source terminal.

The seventh transistor TR7 may supply the initialization voltage VINT to the first terminal of the organic light emitting diode OLED during an activation period of the diode initialization signal GB. In this case, the seventh transistor TR7 may operate in a linear region. In other words, the seventh transistor TR7 may initialize the first terminal of the organic light emitting diode OLED to the initialization voltage VINT during the activation period of the diode initialization signal GB.

In some embodiments, the data initialization signal GI and the diode initialization signal GB may be substantially the same signal. An operation of initializing the gate terminal of each of the first transistors TR1_1 and TR1_2 and an operation of initializing the first terminal of the organic light emitting diode OLED may not affect each other. In other words, an operation of initializing the gate terminal of the first and second driving transistors TR1_1 and TR1_2 and the operation of initializing the first terminal of the organic light emitting diode OLED may be independent from each other. Accordingly, the diode initialization signal GB may not be separately generated, so that economic efficiency of processes may be improved.

The storage capacitor CST (e.g., the first gate electrode 105 and a second gate electrode 130 of FIG. 8) may include a first terminal and a second terminal. The storage capacitor CST may be connected between the high power supply voltage (ELVDD) wire and the gate terminal of the first and second driving transistors TR1_1 and TR1_2. For example, the first terminal of the storage capacitor CST may be connected to the gate terminal of the first and second driving transistors TR1_1 and TR1_2, and the second terminal of the storage capacitor CST may be connected to the high power supply voltage (ELVDD) wire. The storage capacitor CST may maintain a voltage level of the gate terminal of the first and second driving transistors TR1_1 and TR1_2 during an inactivation period of the scan signal GW. The inactivation period of the scan signal GW may include the activation period of the emission control signal EM, and the driving current ID generated by the first and second driving transistors TR1_1 and TR1_2 may be supplied to the organic light emitting diode OLED during the activation period of the emission control signal EM. Therefore, the driving current ID generated by the first and second driving transistors TR1_1 and TR1_2 based on the voltage level maintained by the storage capacitor CST may be supplied to the organic light emitting diode OLED. In some embodiments, the sub-pixel circuit SUB-PIXEL CIRCUIT may include first to seventh transistors TR1_1, TR1_2, TR2, TR3, TR4, TR5, TR6, and TR7 (e.g., eight transistors), at least one storage capacitor CST, and the like.

FIG. 3 is a layout view for describing a sub-pixel circuit region of a substrate included in the organic light emitting display device of FIG. 1, FIG. 4 is a layout view for describing active patterns located in a driving transistor region of FIG. 3, and FIG. 5 is a layout view for describing the active pattern of FIG. 3. For convenience of description, not all the components included in the organic light emitting display device 500 may be shown in FIGS. 3 to 5.

Referring to FIGS. 3, 4, and 5, the organic light emitting display device 500 may include a substrate, an active pattern 100, and the like. As described above, the substrate may have the sub-pixel circuit region 10 including a driving transistor region 60, and the active pattern 100 may be located on the substrate. In the embodiments, the active pattern 100 may include a bent portion 150 and a straight portion 170 in the driving transistor region 60, and a first recess 155_1 and a second recess 155_2 may be formed in the bent portion 150 in a planar direction. In addition, the bent portion 150 of the active pattern 100 may have a first length L1 in the driving transistor region 60, and the straight portion 170 of the active pattern 100 may have a second length L2 in the driving transistor region 60. In this case, the second length L2 may be shorter than the first length L1.

Because the driving transistors of the organic light emitting display device 500 are connected to each other in parallel, and include first and second driving transistors having mutually different channel lengths, when the organic light emitting display device 500 is driven at a low gray level, the organic light emitting display device 500 can improve a low gray-level spot and crosstalk while relatively reducing power consumption.

As shown in FIG. 3, the organic light emitting display device 500 (or the substrate 50) may have a sub-pixel circuit region 10 (e.g., corresponding to the first, second, or third sub-pixel circuit region of FIG. 1). For example, the sub-pixel circuit region 10 may correspond to a region in which a first sub-pixel circuit and a first sub-pixel structure for emitting red light are located, a region in which a second sub-pixel circuit and a second sub-pixel structure for emitting green light are located, or a region in which a third sub-pixel circuit and a third sub-pixel structure for emitting blue light are located (see FIG. 1). The sub-pixel circuit region 10 may include the driving transistor region 60, and a region other than the driving transistor region 60 (or a region surrounding the driving transistor region 60) may be defined as a switching transistor region. The active pattern 100 may be located in the sub-pixel circuit region 10. The bent portion 150 and the straight portion 170 of the active pattern 100 may be located in the driving transistor region 60. Switching transistors that will be described below may be located in the switching transistor region.

As shown in FIG. 4, in the driving transistor region 60 of the sub-pixel circuit region 10, the bent portion 150 may have a bent shape (or a recessed shape) along a plane of the substrate. An empty space formed on an inner side of the bent shape may be defined as a recess, and the number of recesses formed in the planar direction may be determined according to the number of bent shapes. For example, the bent portion 150 shown in FIG. 4 may have two bent shapes, and may have two recesses (e.g., the first recess 155_1 and the second recess 155_2). In some embodiments, the bent portion 150 may have one bent shape or at least three bent shapes. Meanwhile, in the driving transistor region 60 of the sub-pixel circuit region 10, the straight portion 170 may be adjacent to the bent portion 150, and the straight portion 170 may have a straight-line shape along the plane of the substrate.

The first length L1 shown in FIG. 4 may correspond to a total length of the bent portion 150 of the active pattern 100 located in the driving transistor region 60, and the second length L2 shown in FIG. 4 may correspond to a total length of the straight portion 170 of the active pattern 100 located in the driving transistor region 60.

The bent portion 150 of the active pattern 100 may have the first length L1 in the driving transistor region 60, and the first length L1 may be relatively longer than the second length L2, so that the first driving transistor TR1_1 located in the driving transistor region 60 may have a relatively large driving range. For example, the first gate electrode 105 that will be described below may be located in the driving transistor region 60 on the active pattern 100, and the active pattern 100 located under the first gate electrode 105 to overlap the first gate electrode 105 may function as the channel of the first driving transistor TR1_1 that will be described below. In other words, a length of the active pattern 100 located under the first gate electrode 105 to overlap the first gate electrode 105 may correspond to the first length L1. In some embodiments, a width of the bent portion 150 may be relatively reduced in order for the first driving transistor TR1_1 to have a relatively large driving range. In other words, when the bent portion 150 is thin, a driving range of the first driving transistor TR1_1 may be increased. Meanwhile, the straight portion 170 of the active pattern 100 may have a second length L2 in the driving transistor region 60, and the second length L2 may be relatively shorter than the first length L1, so that the second driving transistor TR1_2 located in the driving transistor region 60 may have a relatively small driving range. In addition, in order to change the driving range of the second driving transistor TR1_2, a doping process may be additionally performed so that only the straight portion 170 of the second driving transistor TR1_2 may be doped with phosphorous (P) or boron (B). In the embodiments, the straight portion 170 of the second driving transistor TR1_2 may be doped with phosphorus (P). In other words, the threshold voltage of the second driving transistor TR1_2 may be negatively shifted through the phosphorus (P) doping, and the driving range of the second driving transistor TR1_2 may be changed. In this case, because the first and second driving transistors TR1_1 and TR1_2 are connected to each other in parallel, an average of the driving range of the first driving transistor TR1_1 and the driving range of the second driving transistor TR1_2 may be defined as a driving range of the first and second driving transistors TR1_1 and TR1_2.

For example, according to a conventional organic light emitting display device, a driving range of a driving transistor is increased by controlling an annealing process performed when forming a contact hole of the driving transistor, adjusting a thickness of a gate insulating layer, and increasing a length of an active pattern of the driving transistor so as to improve a low gray-level spot and crosstalk of the organic light emitting display device. In this case, however, a black gray-level voltage Vblack and the like may be increased when the organic light emitting display device is driven at a low gray level, so that power consumption of the organic light emitting display device may be increased.

In the embodiments, because the organic light emitting display device 500 includes the first and second driving transistors TR1_1 and TR1_2 that have the changed driving range, the organic light emitting display device 500 may function as an organic light emitting display device capable of improving the low gray-level spot and the crosstalk while relatively reducing the power consumption when the organic light emitting display device 500 is driven at a low gray level.

As shown in FIG. 5, the active pattern 100 may further include a first extension portion 158, a first protrusion portion 156_1, a second protrusion portion 156_2, a second extension portion 159, a third protrusion portion 157_1, and a fourth protrusion portion 157_2.

The first extension portion 158 may be spaced apart from the bent portion 150 and the straight portion 170, and may extend in the first direction D1. For example, the first extension portion 158 may be located on a left side of the bent portion 150 and the straight portion 170.

The second extension portion 159 may be spaced apart from the bent portion 150 and the straight portion 170 in the second direction D2, and may extend in the first direction D1. For example, the second extension portion 159 may be located on a right side of the bent portion 150 and the straight portion 170, and the second extension portion 159 may be substantially parallel to the first extension portion 158.

The first protrusion portion 156_1 may protrude from the first extension portion 158 in the second direction D2 orthogonal to the first direction D1, and may be connected to a first end of the bent portion 150.

The second protrusion portion 156_2 may be spaced apart from the first protrusion portion 156_1, may protrude from the first extension portion 158 in the second direction D2, and may be connected to a first end of the straight portion 170.

The third protrusion portion 157_1 may protrude from the second extension portion 159 in a third direction D3 opposite to the second direction D2, and may be connected to a second end of the bent portion 150 opposite to the first end of the bent portion 150.

The fourth protrusion portion 157_2 may be spaced apart from the third protrusion portion 157_1, may protrude from the second extension portion 159 in the third direction D3, and may be connected to a second end of the straight portion 170 opposite to the first end of the straight portion 170.

The bent portion 150, the straight portion 170, the first extension portion 158, the first protrusion portion 156_1, the second protrusion portion 156_2, the second extension portion 159, the third protrusion portion 157_1, and the fourth protrusion portion 157_2 may be integrally formed.

As shown in FIG. 5, the active pattern 100 may further include additional extension portions and protrusion portions, and a shape of the active pattern 100 shown in FIG. 5 may be defined by the additional extension portions and protrusion portions.

Figure 9:
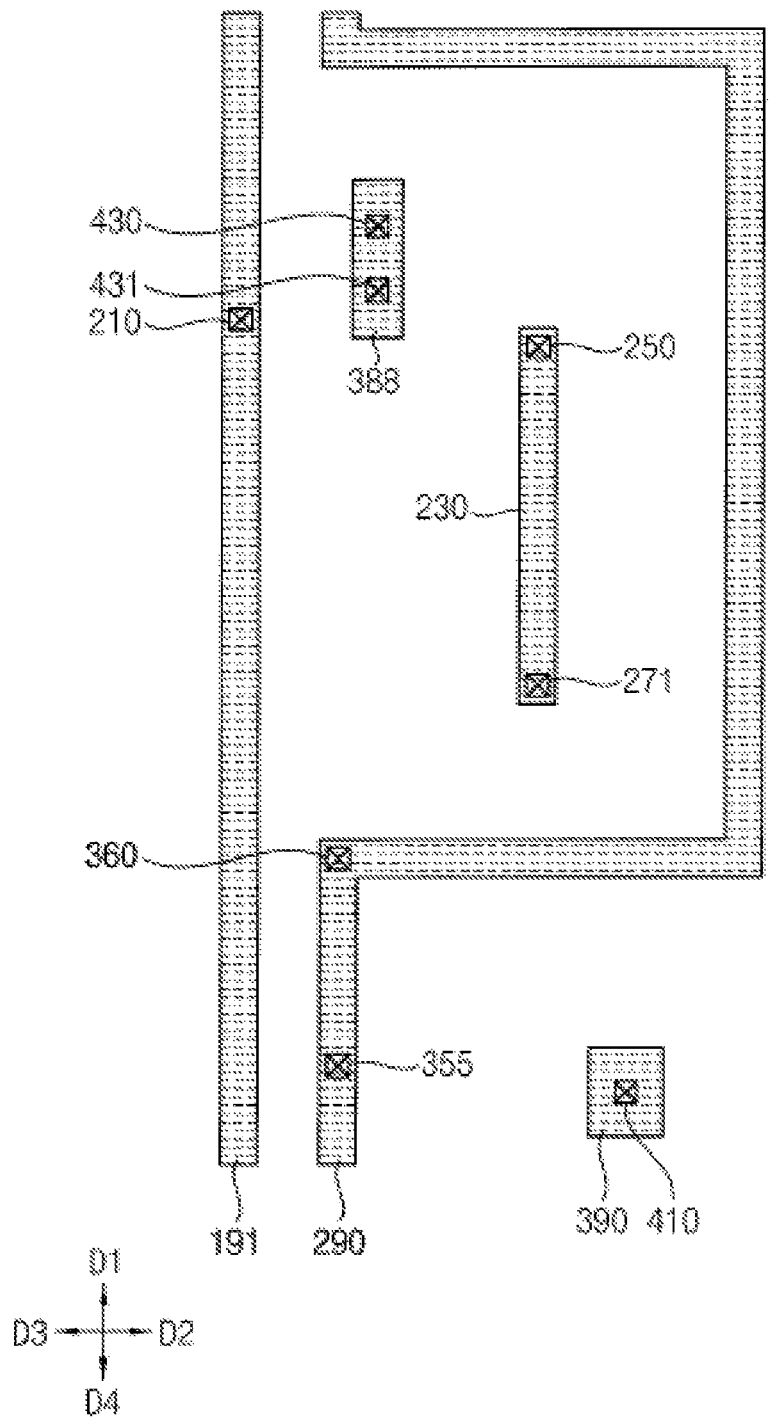
Figure 10:
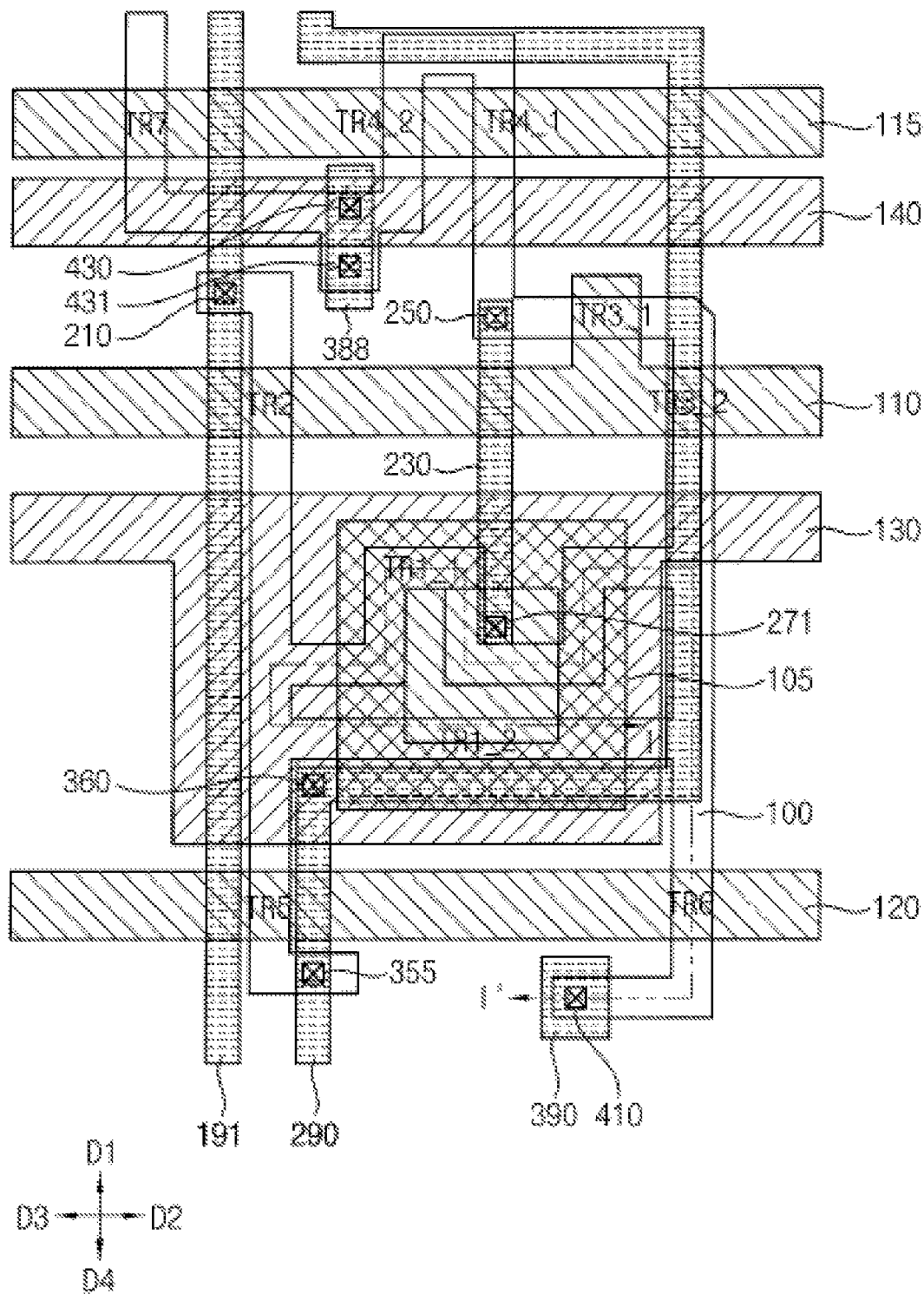

FIGS. 6 to 10 are layout views for describing the organic light emitting display device of FIG. 1, and FIG. 11 is a sectional view taken along line I-I' of the organic light emitting display device of FIG. 10.

Figure 6:
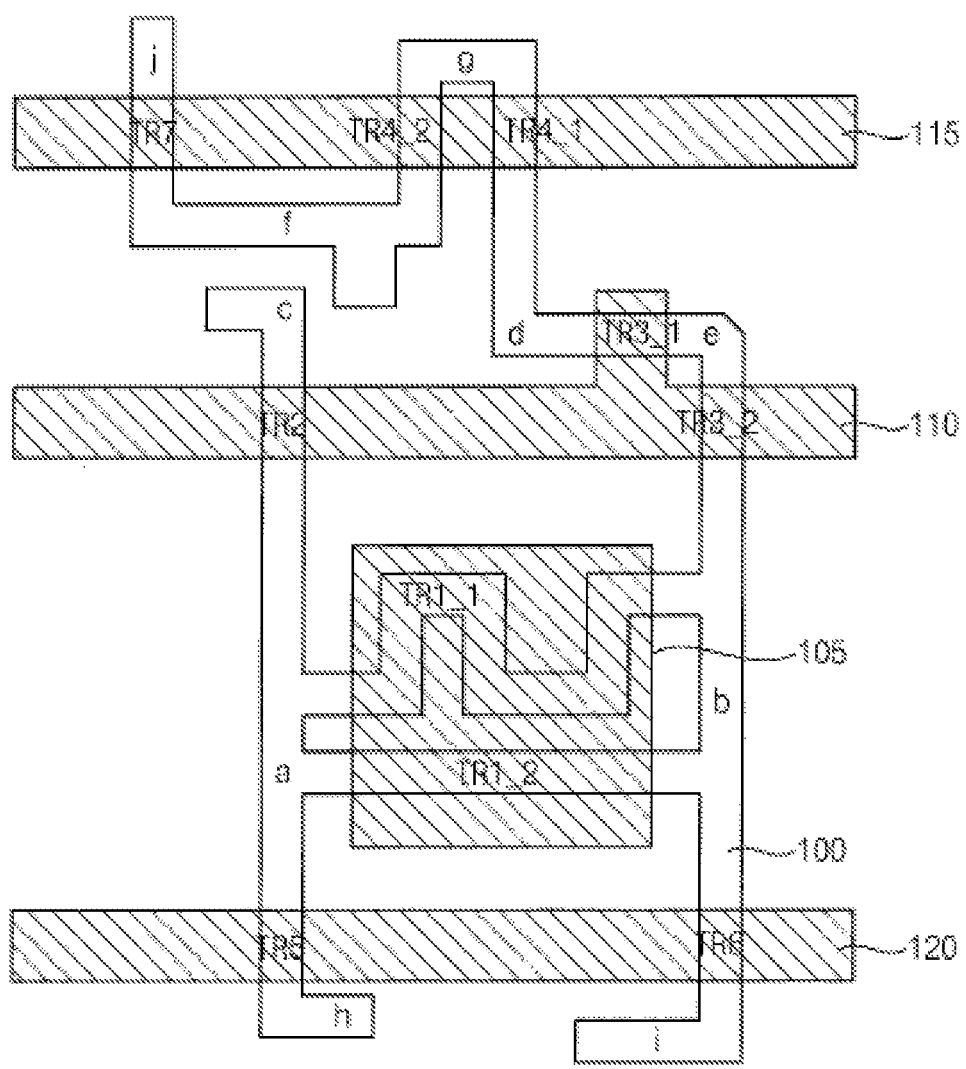
FIGS. 6 to 10 are layout views for describing the organic light emitting display device of FIG. 1.

Referring to FIGS. 6 and 11, the organic light emitting display device 500 may include a substrate 50, an active pattern 100, a gate insulating layer 160, a first gate electrode 105, a first gate wire 110, a second gate wire 115, a third gate wire 120, and the like.

The substrate 50 may include a transparent or opaque material. For example, the substrate 50 may include a quartz substrate, a synthetic quartz substrate, a calcium fluoride substrate, a fluorine-doped quartz substrate (an F-doped quartz substrate), a soda lime glass substrate, a non-alkali glass substrate, and the like. The substrate 50 may have a sub-pixel circuit region 10 including a driving transistor region 60. In some embodiments, the substrate 50 may be a transparent resin substrate having flexibility.

A buffer layer may be located on the substrate 50. The buffer layer may be formed over the whole substrate 50. The buffer layer may prevent metal atoms or impurities from diffusing from the substrate 50 to the transistors and the sub-pixel structure 200, and may control a heat transfer rate during a crystallization process for forming the active pattern 100 to obtain a substantially uniform active pattern 100. In addition, when a surface of the substrate 50 is not uniform, the buffer layer may serve to improve flatness of the surface of the substrate 50. Depending on a type of substrate 50, at least two buffer layers may be provided on the substrate 50, or the buffer layer may not be provided. For example, the buffer layer may include an organic material or an inorganic material.

The active pattern 100 may be located on the substrate 50. The active pattern 100 may be located in the sub-pixel circuit region 10 on the substrate 50. The active pattern 100 may include an oxide semiconductor, an inorganic semiconductor (e.g., amorphous silicon or poly silicon), an organic semiconductor, or the like. In the embodiments, the active pattern 100 may be formed of poly silicon.

For example, a preliminary active layer including amorphous silicon may be formed over the whole substrate 50, and a crystallization process for changing the preliminary active layer from amorphous silicon to poly silicon may be performed. In this case, the crystallization process may be performed by using a crystallization scheme using a metal catalyst, such as a metal-induced crystallization (MIC) scheme, a metal-induced lateral crystallization (MILC) scheme, or a super grain silicon (SG) scheme, or an excimer laser annealing (ELA) scheme using a low-temperature laser. After the crystallization process is performed, the preliminary active layer may be patterned by using a photoresist. The patterned preliminary active layer may be defined as the active pattern 100.

In the embodiments, after the patterning process is performed, a doping process using phosphorus (P) or boron (B) may be performed only on the straight portion 170 of the active pattern 100. For example, a photoresist may be formed on a remaining portion of the active pattern 100 except for the straight portion 170, and the photoresist may expose the straight portion 170. In other words, the doping process may be selectively performed only on the exposed straight portion 170.

The active pattern 100 may include first to tenth regions a, b, c, d, e, f, g, h, and j (e.g., regions where the active pattern 100 does not overlap the first gate electrode 105, the first gate wire 110, the second gate wire 115, and the third gate wire 120). In a step of forming a contact hole, which will be described below, doping of ions may be performed on the first to tenth regions a, b, c, d, e, f, g, h, i, and j, and the first to tenth regions a, b, c, d, e, f, g, h, i, and j may have relatively high electrical conductivity. Boron (B) ions, phosphorus (P) ions, and the like may be used as the ions. The first to tenth regions a, b, c, d, e, f, g, h, i, and j are for indicating regions constituting the source electrodes or the drain electrodes of the first to seventh transistors TR1_1, TR1_2, TR2, TR3_1, TR3_2, TR4_1, TR4_2, TR5, TR6, and TR7, in which boundaries between the regions may not be clearly distinguished, and the regions may be electrically connected to each other. In the embodiments, the first transistors TR1_1 and TR1_2 may correspond to driving transistors, and the second to seventh transistors TR2, TR3_1, TR3_2, TR4_1, TR4_2, TR5, TR6, and TR7 may correspond to switching transistors. In this case, the first transistors TR1_1 and TR1_2 may be defined as the first driving transistor TR1_1 and the second driving transistor TR1_2, respectively.

The gate insulating layer 160 may be located on the active pattern 100. The gate insulating layer 160 may be formed over the whole substrate 50 to cover the active pattern 100 in the sub-pixel circuit region 10 on the substrate 50. For example, the gate insulating layer 160 may sufficiently cover the active pattern 100 on the substrate 50, and may have a substantially flat top surface without creating a step around the active pattern 100. In some embodiments, the gate insulating layer 160 may be formed along a profile of the active pattern 100 with a uniform thickness to cover the active pattern 100 on the substrate 50. The gate insulating layer 160 may include a silicon compound, metal oxide, and the like. For example, the gate insulating layer 160 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like.

The first gate electrode 105, the first gate wire 110, the second gate wire 115, and the third gate wire 120 may be located on the gate insulating layer 160. In other words, the first gate electrode 105, the first gate wire 110, the second gate wire 115, and the third gate wire 120 may be located on the same layer. Each of the first gate electrode 105, the first gate wire 110, the second gate wire 115, and the third gate wire 120 may include a metal, an alloy, metal nitride, conductive metal oxide, a transparent conductive material, and the like. For example, each of the first gate electrode 105, the first gate wire 110, the second gate wire 115, and the third gate wire 120 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten (W), tungsten nitride ($WN_x$), a copper-containing alloy, a molybdenum-containing alloy, titanium nitride ($TiN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. The first gate electrode 105, the first gate wire 110, the second gate wire 115, and the third gate wire 120 may be simultaneously formed by using the same material. In some embodiments, each of the first gate electrode 105, the first gate wire 110, the second gate wire 115, and the third gate wire 120 may have a multilayer structure including a plurality of layers.

The first gate electrode 105 may be located in the driving transistor region 60 of the sub-pixel circuit region 10. The first gate electrode 105 may constitute the first driving transistor TR1_1 and the second driving transistor TR1_2 (e.g., the first transistors TR1_1 and TR1_2) together with the first region a and the second region b. In the embodiments, the first region a may be a source region, and the second region b may be a drain region. In some embodiments, the first region a may be a drain region, and the second region b may be a source region. Ion doping may be performed on the first region a and the second region b. Meanwhile, the ion doping may not be performed on a region of the active pattern 100 located under the first gate electrode 105 (e.g., the driving transistor region 60). For example, the first region a and the second region b may operate as conductors, the bent portion 150 of the driving transistor region 60 may operate as the channel of the first driving transistor TR1_1, and the straight portion 170 of the driving transistor region 60 may operate as the channel of the second driving transistor TR1_2. Therefore, the first and second driving transistors TR1_1 and TR1_2 may generate the driving current ID of FIG. 2 supplied to the sub-pixel structure 200 (e.g., the organic light emitting diode OLED of FIG. 2), and the sub-pixel structure 200 may output light based on the driving current ID.

The first gate wire 110 may include: a gate extension portion extending in the second direction D2 on the active pattern 100 and the gate insulating layer 160; and a gate protrusion portion protruding from the gate extension portion in the first direction D1. The gate protrusion portion may constitute the third transistor TR3_1 together with the fourth region d and the fifth region e. For example, the gate protrusion portion may function as the gate electrode of the third transistor TR3_1. The gate extension portion may include a first portion overlapping the second extension portion 159, and a second portion overlapping the first extension portion 158 (see FIGS. 5 and 6). The first portion of the gate extension portion may constitute the third transistor TR3_2 (e.g., a second switching transistor) together with the second region b and the fifth region e, and the second portion of the gate extension portion may constitute the second transistor TR2 (e.g., a first switching transistor) together with the first region a and the third region c. In this case, the third transistor TR3_1 and the third transistor TR3_2 may be connected to each other in series, and may operate as a dual gate transistor. For example, when the dual gate transistor is turned off, a leakage current may be reduced. Therefore, the third transistor TR3_1 and the third transistor TR3_2 may be electrically connected to each other through the fifth region e. In addition, the first transistors TR1_1 and TR1_2, the second transistor TR2, and the fifth transistor TR5 may be electrically connected to each other through the first region a, and the first transistors TR1_1 and TR1_2, the third transistor TR3_2, and the sixth transistor TR6 may be electrically connected to each other through the second region b.

The ion doping may be performed on the first region a, the second region b, the third region c, the fourth region d, and the fifth region e. Meanwhile, the ion doping may not be performed on regions of the active pattern 100 located under the first gate wire 110. Therefore, the first region a, the second region b, the third region c, the fourth region d, and the fifth region e may operate as conductors, and the regions of the active pattern 100 located under the first gate wire 110 may operate as a channel of the second transistor TR2 and channels of the third transistors TR3_1 and TR3_2, respectively. In the embodiments, the first gate wire 110 may receive the scan signal GW of FIG. 2.

In the embodiments, each of the third region c of the second transistor TR2, the fourth region d of the third transistor TR3_1, and the fifth region e of the third transistor TR3_2 may be a source region, and each of the first region a of the second transistor TR2, the fifth region e of the third transistor TR3_1, and the second region b of the third transistor TR3_2 may be a drain region. In some embodiments, each of the third region c of the second transistor TR2, the fourth region d of the third transistor TR3_1, and the fifth region e of the third transistor TR3_2 may be a drain region, and each of the first region a of the second transistor TR2, the fifth region e of the third transistor TR3_1, and the second region b of the third transistor TR3_2 may be a source region.

The second gate wire 115 may extend in the second direction D2 on the active pattern 100 and the gate insulating layer 160. The second gate wire 115 may constitute the seventh transistor TR7 together with the sixth region f and the tenth region j, may constitute the fourth transistor TR4_2 together with the sixth region f and the seventh region g, and may constitute the fourth transistor TR4_1 together with the seventh region g and the fourth region d. In this case, the fourth transistor TR4_1 and the fourth transistor TR4_2 may be connected to each other in series, and may operate as a dual gate transistor. For example, when the dual gate transistor is turned off, a leakage current may be reduced. Therefore, the fourth transistor TR4_1 and the fourth transistor TR4_2 may be electrically connected to each other through the seventh region g. In addition, the seventh transistor TR7 and the fourth transistor TR4_2 may be electrically connected to each other through the sixth region f, and the tenth region j may be electrically connected to the ninth region i.

The ion doping may be performed on the fourth region d, the sixth region f, the seventh region g, and the tenth region j. Meanwhile, the ion doping may not be performed on regions of the active pattern 100 located under the second gate wire 115. Accordingly, the fourth region d, the sixth region f, the seventh region g, and the tenth region j may operate as conductors, and the regions of the active pattern 100 located under the second gate wire 115 may operate as a channel of the fourth transistor TR4_1, a channel of the fourth transistor TR4_2, and a channel of the seventh transistor TR7. In the embodiments, the second gate wire 115 may receive the data initialization signal GI of FIG. 2, and the sixth region f may receive the initialization voltage VINT of FIG. 2.

In embodiments, each of the tenth region j of the seventh transistor TR7, the sixth region f of the fourth transistor TR4_2, and the seventh region g of the fourth transistor TR4_1 may be a source region, and each of the sixth region f of the seventh transistor TR7, the seventh region g of the fourth transistor TR4_2, and the fourth region d of the fourth transistor TR4_1 may be a drain region. In some embodiments, each of the tenth region j of the seventh transistor TR7, the sixth region f of the fourth transistor TR4_2, and the seventh region g of the fourth transistor TR4_1 may be a drain region, and each of the sixth region f of the seventh transistor TR7, the seventh region g of the fourth transistor TR4_2, and the fourth region d of the fourth transistor TR4_1 may be a source region.

The third gate wire 120 may constitute the fifth transistor TR5 together with the first region a and the eighth region h, and may constitute the sixth transistor TR6 together with the second region b and the ninth region i. The ion doping may be performed on the first region a, the second region b, the eighth region h, and the ninth region i. Meanwhile, the ion doping may not be performed on regions of the active pattern 100 located under the third gate wire 120. Therefore, the first region a, the second region b, the eighth region h, and the ninth region i may operate as conductors, and the regions of the active pattern 100 located under the third gate wire 120 may operate as a channel of the fifth transistor TR5 and a channel of the sixth transistor TR6, respectively. In the embodiments, the third gate wire 120 may receive the emission control signal EM of FIG. 2.

In the embodiments, each of the eighth region h of the fifth transistor TR5 and the ninth region i of the sixth transistor TR6 may be a source region, and each of the first region a of the fifth transistor TR5 and the second region b of the sixth transistor TR6 may be a drain region. In some embodiments, each of the eighth region h of the fifth transistor TR5 and the ninth region i of the sixth transistor TR6 may be a drain region, and each of the first region a of the fifth transistor TR5 and the second region b of the sixth transistor TR6 may be a source region.

Figure 7:
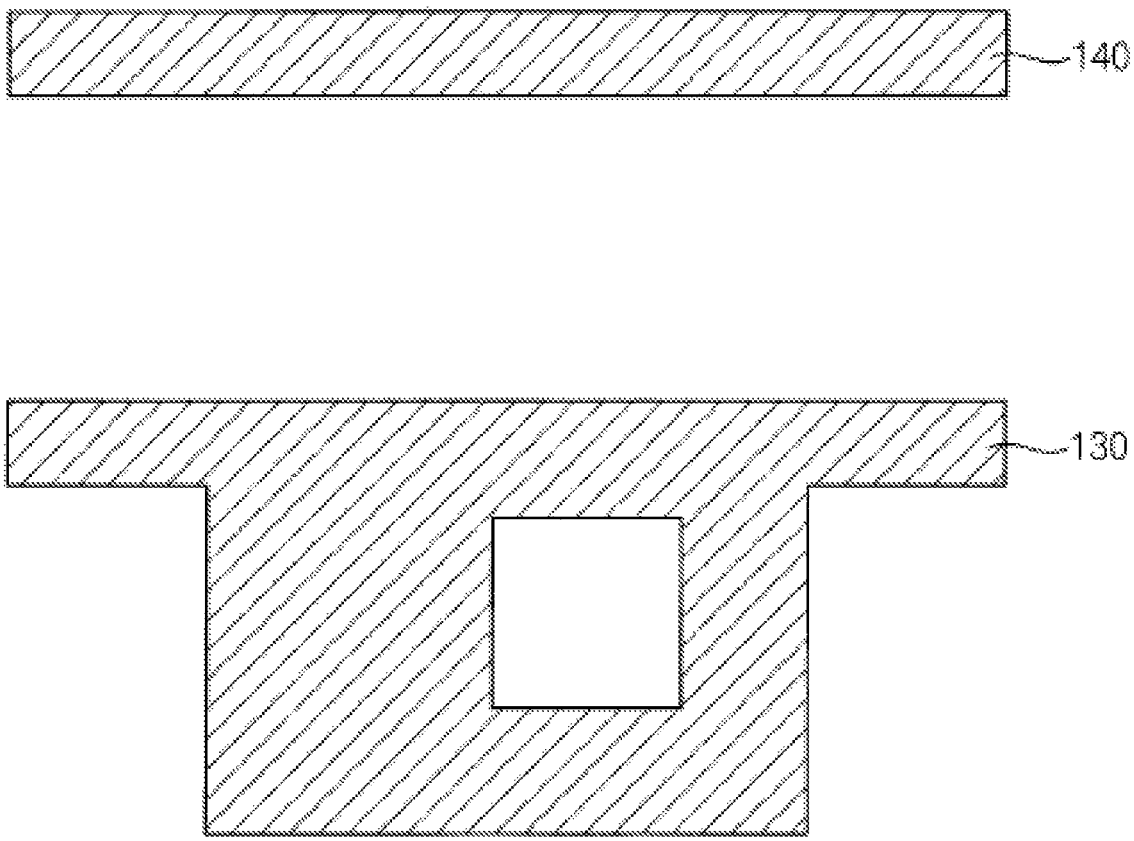

Referring to FIGS. 7, 8, and 11, the organic light emitting display device 500 may further include a first interlayer insulating layer 190, a second gate electrode 130, and an initialization voltage wire 140.

The first interlayer insulating layer 190 may be located on the first gate electrode 105, the first gate wire 110, the second gate wire 115, and the third gate wire 120. The first interlayer insulating layer 190 may be formed over the whole gate insulating layer 160 to cover the first gate electrode 105, the first gate wire 110, the second gate wire 115, and the third gate wire 120 in the sub-pixel circuit region 10 on the gate insulating layer 160. For example, the first interlayer insulating layer 190 may sufficiently cover the first gate electrode 105, the first gate wire 110, the second gate wire 115, and the third gate wire 120 on the gate insulating layer 160, and may have a substantially flat top surface without creating a step around the first gate electrode 105, the first gate wire 110, the second gate wire 115, and the third gate wire 120. In some embodiments, the first interlayer insulating layer 190 may be formed along a profile of the first gate electrode 105, the first gate wire 110, the second gate wire 115, and the third gate wire 120 with a uniform thickness to cover the first gate electrode 105, the first gate wire 110, the second gate wire 115, and the third gate wire 120 on the gate insulating layer 160. The first interlayer insulating layer 190 may include a silicon compound, metal oxide, and the like.

The second gate electrode 130 and the initialization voltage wire 140 may be located on the first interlayer insulating layer 190. In other words, the second gate electrode 130 and the initialization voltage wire 140 may be located on the same layer. Each of the second gate electrode 130 and the initialization voltage wire 140 may include a metal, an alloy, metal nitride, conductive metal oxide, a transparent conductive material, and the like. These may be used alone or in combination with each other. The second gate electrode 130 and the initialization voltage wire 140 may be simultaneously formed by using the same material. In some embodiments, each of the second gate electrode 130 and the initialization voltage wire 140 may have a multilayer structure including a plurality of layers.

The second gate electrode 130 may extend in the second direction D2 on the first interlayer insulating layer 190. The second gate electrode 130 may overlap the first gate electrode 105 in the driving transistor region 60 of the sub-pixel circuit region 10. Accordingly, the second gate electrode 130 may constitute the storage capacitor CST of FIG. 2 together with the first gate electrode 105 in the driving transistor region 60. The second gate electrode 130 may receive the high power supply voltage ELVDD of FIG. 2. In addition, the second gate electrode 130 may have a first opening that exposes a part of the first gate electrode 105 in the driving transistor region 60. The first gate electrode 105 may receive the initialization voltage VINT of FIG. 2 through the first opening and through a first connection pattern that will be described below.

The initialization voltage wire 140 may extend in the second direction D2 on the first interlayer insulating layer 190. The initialization voltage wire 140 may overlap the sixth region f, and may provide the initialization voltage VINT to the sixth region f of the sub-pixel circuit region 10 through a second connection pattern that will be described below.

Referring to FIGS. 9, 10, and 11, the organic light emitting display device 500 may further include a second interlayer insulating layer 195, a high power supply voltage wire 290, a data wire 191, a first connection pattern 230, a second connection pattern 388, a third connection pattern 390, a planarization layer 270, a pixel defining layer 310, a sub-pixel structure 200, and an encapsulation substrate 450. In this case, the sub-pixel structure 200 may include a lower electrode 291, a light emitting layer 330, and an upper electrode 340.

The second interlayer insulating layer 195 may be located on the second gate electrode 130 and the initialization voltage wire 140. The second interlayer insulating layer 195 may be formed over the whole first interlayer insulating layer 190 to cover the second gate electrode 130 and the initialization voltage wire 140 in the sub-pixel circuit region 10 on the first interlayer insulating layer 190. For example, the second interlayer insulating layer 195 may sufficiently cover the second gate electrode 130 and the initialization voltage wire 140 on the first interlayer insulating layer 190, and may have a substantially flat top surface without creating a step around the second gate electrode 130 and the initialization voltage wire 140. In some embodiments, the second interlayer insulating layer 195 may be formed along a profile of the second gate electrode 130 and the initialization voltage wire 140 with a uniform thickness to cover the second gate electrode 130 and the initialization voltage wire 140 on the first interlayer insulating layer 190. The second interlayer insulating layer 195 may include a silicon compound, metal oxide, and the like.

The high power supply voltage wire 290, the data wire 191, the first connection pattern 230, the second connection pattern 388, and the third connection pattern 390 may be located on the second interlayer insulating layer 195. In other words, the high power supply voltage wire 290, the data wire 191, the first connection pattern 230, the second connection pattern 388, and the third connection pattern 390 may be located on the same layer. Each of the high power supply voltage wire 290, the data wire 191, the first connection pattern 230, the second connection pattern 388, and the third connection pattern 390 may include a metal, an alloy, metal nitride, conductive metal oxide, a transparent conductive material, and the like. These may be used alone or in combination with each other. The high power supply voltage wire 290, the data wire 191, the first connection pattern 230, the second connection pattern 388, and the third connection pattern 390 may be simultaneously formed by using the same material. In some embodiments, each of the high power supply voltage wire 290, the data wire 191, the first connection pattern 230, the second connection pattern 388, and the third connection pattern 390 may have a multilayer structure including a plurality of layers.

The data wire 191 may extend in the first direction D1 in the driving transistor region 60 on the second interlayer insulating layer 195, and may be connected to the third region c of the active pattern 100 through a contact hole 210. The data wire 191 may receive the data signal DATA of FIG. 2. Accordingly, the data wire 191 may supply the data signal DATA to the third region c of the active pattern 100 through the contact hole 210. In this case, the voltage level of the data signal DATA may be changed to express the gray levels.

The high power supply voltage wire 290 may extend in the first direction D1 while being spaced apart from the data wire 191 in the sub-pixel circuit region 10 on the second interlayer insulating layer 195, may be connected to the eighth region h of the active pattern 100 through a contact hole 355, and may be connected to the second gate electrode 130 located in the sub-pixel circuit region 10 through a contact hole 360. The high power supply voltage wire 290 may receive the high power supply voltage ELVDD of FIG. 2. Accordingly, the high power supply voltage wire 290 may supply the high power supply voltage ELVDD to the eighth region h of the active pattern 100 through the contact hole 355, and may supply the high power supply voltage ELVDD to the second gate electrode 130 through the contact hole 360.

The first connection pattern 230 may extend in the first direction D1 in the sub-pixel circuit region 10 on the second interlayer insulating layer 195, and may overlap a part of the fourth region d of the active pattern 100 and a part of the driving transistor region 60. The first connection pattern 230 may be connected to the fourth region d of the active pattern 100 through a contact hole 250, and may be connected to the first gate electrode 105 through a contact hole 271. The fourth region d of the active pattern 100 may receive an initialization voltage VINT, and the initialization voltage VINT may be applied to the first gate electrode 105 through the first connection pattern 230.

The second connection pattern 388 may overlap a part of the initialization voltage wire 140 and a part of the sixth region f of the active pattern 100 in the sub-pixel circuit region 10 on the second interlayer insulating layer 195. The second connection pattern 388 may be connected to the initialization voltage wire 140 and a contact hole 430, and may be connected to the sixth region f of the active pattern 100 through a contact hole 431. The initialization voltage VINT may be supplied to the sixth region f of the active pattern 100 through the second connection pattern 388.

The third connection pattern 390 may overlap the ninth region i of the active pattern 100 in the sub-pixel circuit region 10 on the second interlayer insulating layer 195. The third connection pattern 390 may be connected to the ninth region i of the active pattern 100 through a contact hole 410, may make contact with the lower electrode 291, and may supply the driving current to the lower electrode 291.

The planarization layer 270 may be located on the second interlayer insulating layer 195, the high power supply voltage wire 290, the data wire 191, the first connection pattern 230, the second connection pattern 388, and the third connection pattern 390. The planarization layer 270 may have a first contact hole that exposes a part of the third connection pattern 390 connected to the sixth transistor TR6 located in the sub-pixel circuit region 10. The planarization layer 270 may have a relatively thick thickness to sufficiently cover the high power supply voltage wire 290, the data wire 191, the first connection pattern 230, the second connection pattern 388, and the third connection pattern 390 on the second interlayer insulating layer 195. In this case, the planarization layer 270 may have a substantially flat top surface. In order to implement such a flat top surface of the planarization layer 270, a planarization process may be additionally performed on the planarization layer 270. The planarization layer 270 may include an organic material, an inorganic material, and the like. In the embodiments, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, and the like.

The lower electrode 291 may be located in the sub-pixel circuit region 10 on the planarization layer 270. The lower electrode 291 may make direct contact with the third connection pattern 390 through the first contact hole of the planarization layer 270, and may be electrically connected to the sixth transistor TR6 located in the sub-pixel circuit region 10 through the third connection pattern 390. Accordingly, the lower electrode 291 may receive the driving current ID of FIG. 2 through the third connection pattern 390. In the embodiments, the lower electrode 291 may be an anode electrode. In some embodiments, the lower electrode 291 may be a cathode electrode. The lower electrode 291 may include a metal, an alloy, metal nitride, conductive metal oxide, a transparent conductive material, and the like. These may be used alone or in combination with each other. The lower electrode 291 may have a multilayer structure including a plurality of layers.

The pixel defining layer 310 may be located on a part of the lower electrode 291 and the planarization layer 270. The pixel defining layer 310 may cover both sides of the lower electrode 291, and may have an opening that exposes a part of a top surface of the lower electrode 291. The pixel defining layer 310 may be formed of an organic material or an inorganic material. In the embodiments, the pixel defining layer 310 may include an organic material.

The light emitting layer 330 may be located on the lower electrode 291 exposed by the pixel defining layer 310. The light emitting layer 330 may be formed by using at least one of light emitting materials for emitting different color lights (i.e., red light, green light, blue light, etc.) according to sub-pixels. Alternatively, the light emitting layer 330 may be formed by stacking a plurality of light emitting materials for generating different color lights such as red light, green light, and blue light to emit white light as a whole. In this case, a color filter may be located on the light emitting layer 330 (e.g., located on a top surface of the encapsulation substrate 450 to overlap the light emitting layer 330). The color filter may include at least one of a red color filter, a green color filter, or a blue color filter. In some embodiments, the color filter may include a yellow color filter, a cyan color filter, and a magenta color filter. The color filter may include a photosensitive resin, a color photoresist, and the like.

The upper electrode 340 may be located on the pixel defining layer 310 and the light emitting layer 330. The upper electrode 340 may be formed over the whole substrate 50 to cover the pixel defining layer 310 and the light emitting layer 330. In the embodiments, the upper electrode 340 may be a cathode electrode, and may receive the low power supply voltage ELVSS of FIG. 2. In some embodiments, the upper electrode 340 may be an anode electrode. The upper electrode 340 may include a metal, an alloy, metal nitride, conductive metal oxide, a transparent conductive material, and the like. These may be used alone or in combination with each other. The upper electrode 340 may have a multilayer structure including a plurality of layers.

The encapsulation substrate 450 may be located on the upper electrode 340. The encapsulation substrate 450 may include substantially the same material as the substrate 50. For example, the encapsulation substrate 450 may include a quartz substrate, a synthetic quartz substrate, a quartz substrate doped with calcium fluoride or fluorine, a soda lime glass substrate, a non-alkali glass substrate, and the like. In other embodiments, the encapsulation substrate 450 may be formed of a transparent inorganic material or flexible plastic. For example, the encapsulation substrate 450 may include a transparent resin substrate having flexibility. In this case, in order to improve flexibility of the organic light emitting display device 500, the encapsulation substrate 450 may have a structure in which at least one inorganic layer and at least one organic layer may be alternately stacked. The stacked structure may include a first inorganic layer, an organic layer, and a second inorganic layer. For example, the first inorganic layer having flexibility may be formed along a profile of the upper electrode 340, the organic layer having flexibility may be located on the first inorganic layer, and the second inorganic layer having flexibility may be located on the organic layer. In other words, the stacked structure may correspond to a thin film encapsulation structure that makes direct contact with the upper electrode 340.

Because the organic light emitting display device 500 according to the embodiments of the present invention includes the first driving transistor TR1_1 and the second driving transistor TR1_2 that are connected to each other in parallel and have mutually different channel lengths, when the organic light emitting display device 500 is driven at a low gray level, the organic light emitting display device 500 can improve the low gray-level spot and the crosstalk while relatively reducing the power consumption.

Figure 12:
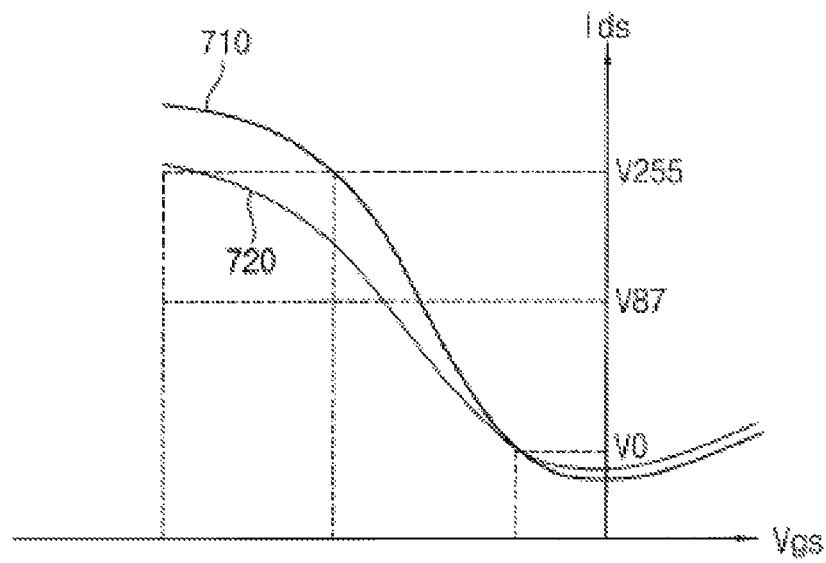
FIG. 12 is a graph showing driving ranges of driving transistors according to comparative examples.

FIG. 12 is a graph showing driving ranges of driving transistors according to comparative examples. For example, a graph 710 may correspond to a first driving range 710 of a driving transistor included in a first organic light emitting display device, and a graph 720 may correspond to a second driving range 720 of a driving transistor included in a second organic light emitting display device.

Referring to FIG. 12, in the first organic light emitting display device including the driving transistor that has the first driving range 710, the low gray-level spot and the crosstalk may be generated when the first organic light emitting display device is driven at a low gray level.

In order to prevent the generation of the low gray-level spot and the crosstalk, the second organic light emitting display device including the driving transistor that has the second driving range 720 may be manufactured. For example, the driving transistor included in the second organic light emitting display device may have a driving range of a driving gate-source voltage Vgs that is relatively increased as compared with a driving range of a driving gate-source voltage Vgs of the driving transistor included in the first organic light emitting display device. Accordingly, when the second organic light emitting display device is driven at a low gray level, the low gray-level spot and the crosstalk may not be generated in the second organic light emitting display device. However, as a driving range of the driving gate-source voltage Vgs increases, the black gray-level voltage Vblack may be increased (e.g., a difference between a driving gate-source voltage Vgs corresponding to a maximum gray level and a driving gate-source voltage Vgs corresponding to a minimum gray level may be increased), so that the power consumption of the second organic light emitting display device may be increased.

Figure 13:
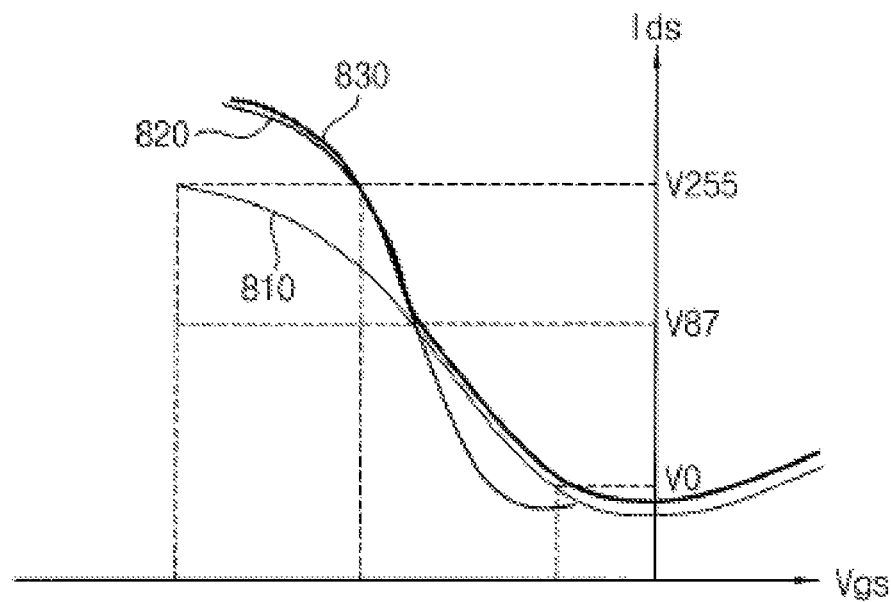
FIG. 13 is a graph showing a driving range of first and second driving transistors of FIG. 10.
Figure 14:
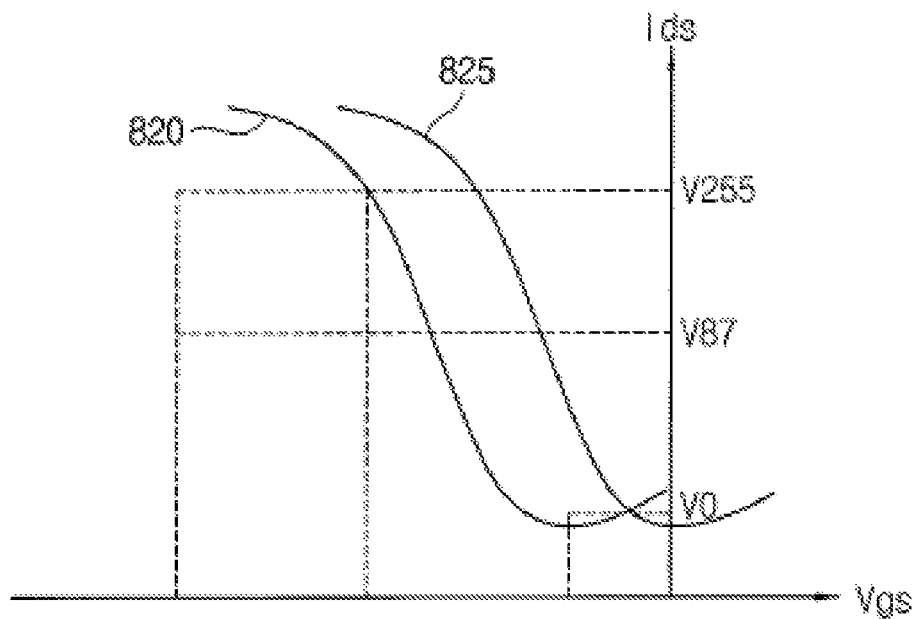
FIG. 14 is a graph for describing a driving range according to whether a straight portion included in a second driving transistor of FIG. 13 is doped or not.
Figure 15:
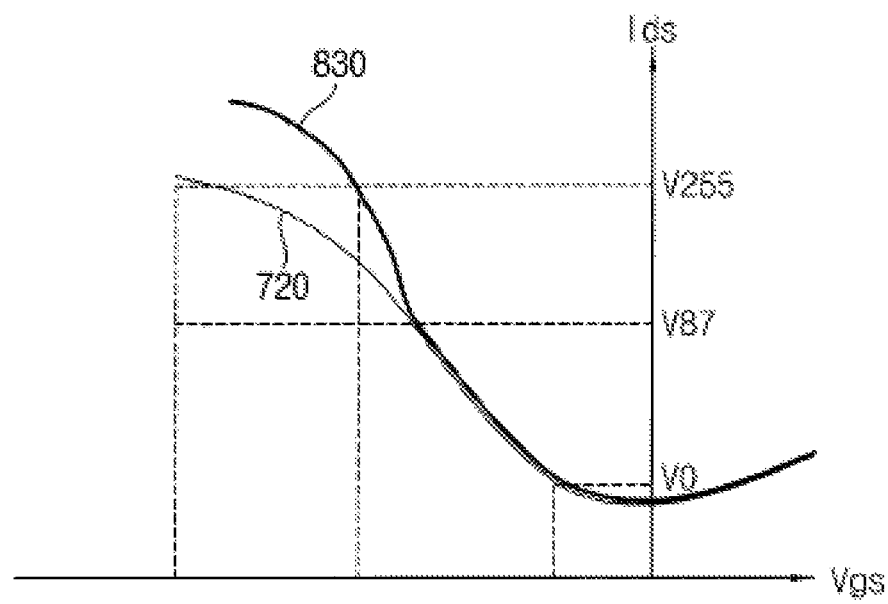
FIG. 15 is a graph showing the driving range of the first and second driving transistors of FIG. 10 and the driving range of the driving transistor of the comparative example.

FIG. 13 is a graph showing a driving range of first and second driving transistors of FIG. 10, FIG. 14 is a graph for describing a driving range according to whether a straight portion included in a second driving transistor of FIG. 13 is doped or not, and FIG. 15 is a graph showing the driving range of the first and second driving transistors of FIG. 10 and the driving range of the driving transistor of the comparative example. For example, a graph 810 may correspond to a driving range of a first driving transistor TR1_1 of FIG. 10, a graph 820 may correspond to a driving range of a second driving transistor TR1_2 of FIG. 10, and a graph 830 may correspond to a driving range of the first and second driving transistors TR1_1 and TR1_2.

Referring to FIG. 13, because the first driving transistor TR1_1 has a relatively long channel length, the driving range 810 of the first driving transistor TR1_1 may be relatively increased.

Because the second driving transistor TR1_2 has a relatively short channel length, the driving range 820 of the second driving transistor TR1_2 may be relatively reduced. In this case, in order to implement the driving range 820 of the second driving transistor TR1_2 shown in FIG. 13, the straight portion 170 corresponding to the channel of the second driving transistor TR1_2 has to be doped with phosphorus (P).

For example, as shown in FIG. 14, a graph 825 may correspond to a driving range of the second driving transistor TR1_2 including the straight portion 170 before a doping process. When the doping process is performed on the straight portion 170, the graph 825 may be negatively shifted. In other words, the driving range of the second driving transistor TR1_2 may be changed from the graph 825 to the graph 820 through the doping process.

Referring again to FIG. 13, because the first and second driving transistors TR1_1 and TR1_2 are connected to each other in parallel, an average of the driving range 810 of the first driving transistor TR1_1 and the driving range 820 of the second driving transistor TR1_2 may be defined as a driving range 830 of the first and second driving transistors TR1_1 and TR1_2.

Referring to FIG. 15, when compared with the second organic light emitting display device including the driving transistor that has the second driving range 720, because the organic light emitting display device 500 including the first and second driving transistors TR1_1 and TR1_2 that have the driving range 830 has substantially the same driving range as the second driving range 720 at a low gray level, the low gray-level spot and the crosstalk may not be generated when the organic light-emitting display device 500 is driven at a low gray level. In addition, because the organic light emitting display device 500 has a relatively reduced driving range at a high gray level, as the driving range of the driving gate-source voltage Vgs relatively decreases, the black gray-level voltage Vblack may be reduced, so that the power consumption of the organic light emitting display device 500 may be relatively reduced.

Figure 16:
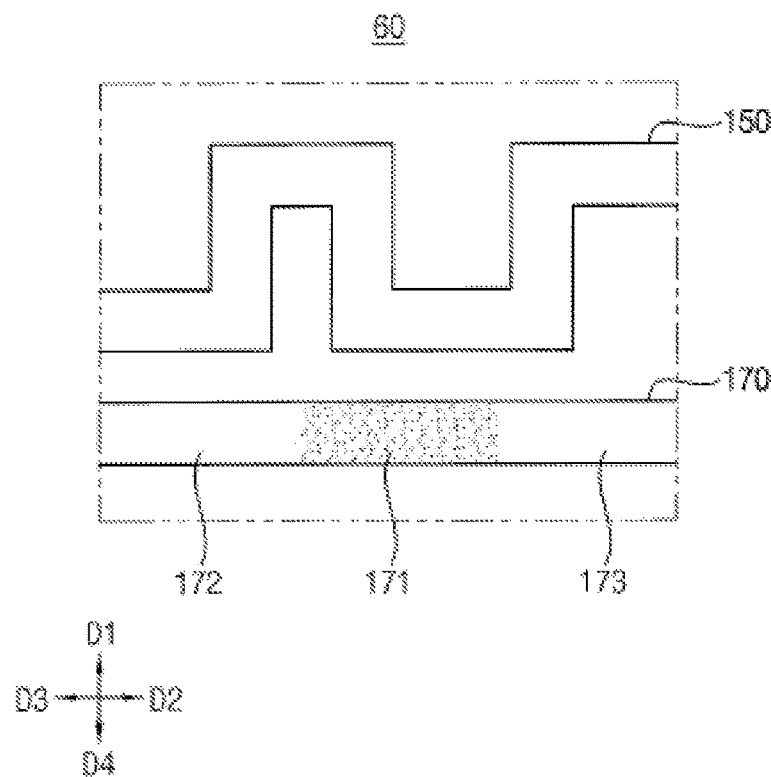
FIG. 16 is a layout view showing one example of the active pattern included in the organic light emitting display device according to the embodiments.
Figure 17:
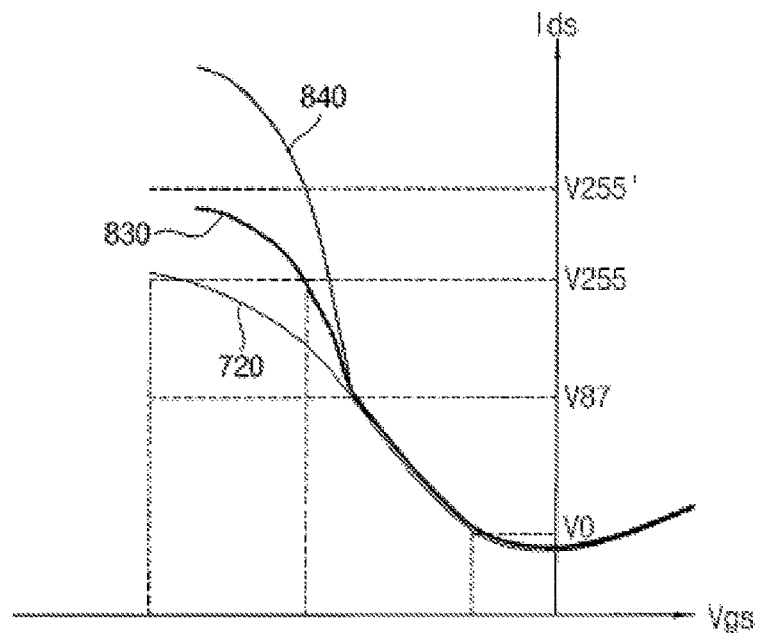
FIG. 17 is a graph for describing the driving range of the driving transistor included in the organic light emitting display device of FIG. 16.

FIG. 16 is a layout view showing one example of the active pattern included in the organic light emitting display device according to the embodiments, and FIG. 17 is a graph for describing the driving range of the driving transistor included in the organic light emitting display device of FIG. 16. For example, FIG. 16 may correspond to a layout view for describing the active pattern located in the driving transistor region of FIG. 4. An organic light emitting display device illustrated in FIG. 16 may have a configuration that is substantially identical or similar to the configuration of the organic light emitting display device 500 described with reference to FIGS. 1 to 11 except for a doped portion of the active pattern 100. In FIG. 16, redundant descriptions of components that are substantially identical or similar to the components described with reference to FIGS. 1 to 11 will be omitted.

Referring to FIGS. 16 and 17, in order to change the driving range of the second driving transistor TR1_2, a doping process may be additionally performed so that at least a part of the straight portion 170 of the second driving transistor TR1_2 may be doped with phosphorous (P) or boron (B).

For example, the straight portion 170 may have a channel region 171 and source and drain regions 172 and 173 surrounding the channel region 171. In the embodiments, at least a part of the straight portion 170 of the second driving transistor TR1_2 may be doped with phosphorus (P). In other words, the channel region 171 of the straight portion 170 of the second driving transistor TR1_2 may be doped with phosphorus (P), and the ion doping may be performed on the source and drain regions 172 and 173 so that the source and drain regions 172 and 173 may have relatively high electrical conductivity. As the channel length of the second driving transistor TR1_2 is relatively reduced, as shown in FIG. 17, a driving range 840 of the second driving transistor TR1_2 may have a relatively steep inclination at a high gray level. The first and second driving transistors TR1_1 and TR1_2 may be included in a transparent organic light emitting display device and the like that use a relatively large driving current.

Figure 18:
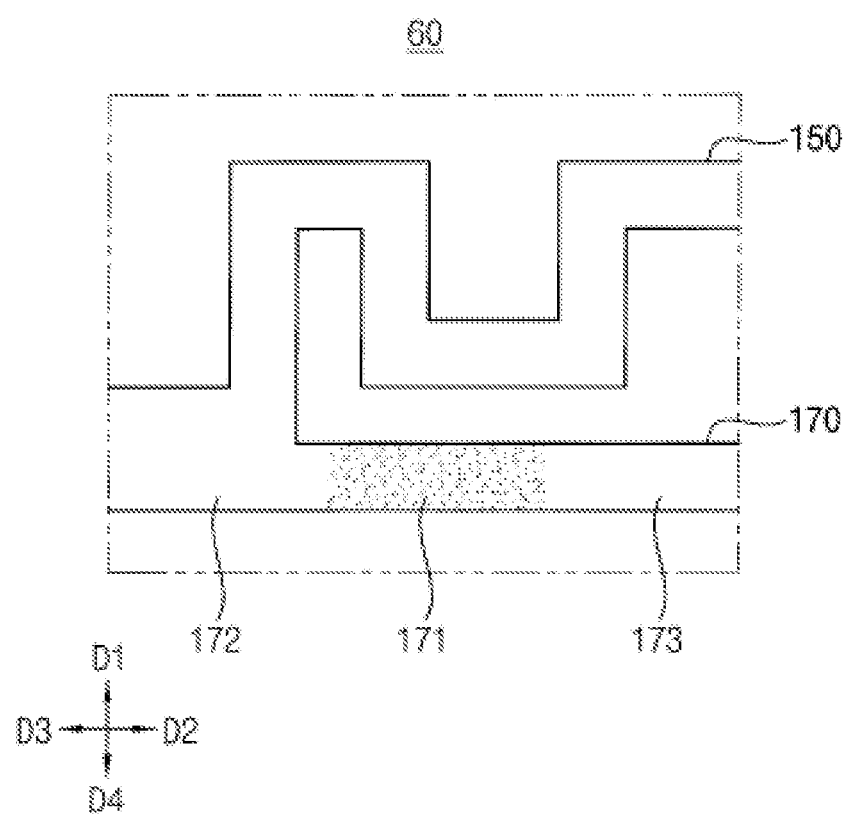
FIG. 18 is a layout view showing another example of the active pattern included in the organic light emitting display device according to the embodiments.

FIG. 18 is a layout view showing another example of the active pattern included in the organic light emitting display device according to the embodiments. For example, FIG. 18 may correspond to a layout view for describing the active pattern located in the driving transistor region of FIG. 4. An organic light emitting display device illustrated in FIG. 18 may have a configuration substantially identical or similar to the configuration of the organic light emitting display device described with reference to FIG. 16 except for the shape of the active pattern 100. In FIG. 18, redundant descriptions of components that are substantially identical or similar to the components described with reference to FIG. 16 will be omitted.

Referring to FIG. 18, the first end of the bent portion 150 and a source region 172 of the straight portion 170 may be integrally formed.

For example, the active pattern 100 may include a first extension portion 158, a first protrusion portion, a second extension portion 159, a second protrusion portion 157_1, and a third protrusion portion 157_2 (see FIG. 5).

The first extension portion 158 may be spaced apart from the bent portion 150 and the straight portion 170, and may extend in the first direction D1. For example, the first extension portion 158 may be located on the left side of the bent portion 150 and the straight portion 170.

The second extension portion 159 may be spaced apart from the bent portion 150 and the straight portion 170 in the second direction D2, and may extend in the first direction D1. For example, the second extension portion 159 may be located on the right side of the bent portion 150 and the straight portion 170, and the second extension portion 159 may be substantially parallel to the first extension portion 158.

The first protrusion portion may protrude from the first extension portion 158 in the second direction D2, and may be connected to the first end of the bent portion 150 and the first end of the straight portion 170 (e.g., the source region 172 of the straight portion 170).

The second protrusion portion 157_1 may protrude from the second extension portion 159 in the third direction D3, and may be connected to the second end of the bent portion 150.

The third protrusion portion 157_2 may be spaced apart from the second protrusion portion 157_1, may protrude from the second extension portion 159 in the third direction D3, and may be connected to the second end of the straight portion 170 (e.g., a drain region 173 of the straight portion 170).

The bent portion 150, the straight portion 170, the first extension portion 158, the first protrusion portion, the second extension portion 159, the second protrusion portion 157_1, and the third protrusion portion 157_2 may be integrally formed. In this case, the first end of the bent portion 150 may extend in a fourth direction D4 opposite to the first direction D1 to make contact with the first end of the straight portion 170, so that a total length of the bent portion 150 may be relatively increased.

In other embodiments, the bent portion 150 may include a first region and a second region, and the first and second regions may be alternately and repeatedly arranged. The first regions may function as channels of the first driving transistor TR1_1, and the ion doping may be performed on the second regions. In other words, the bent portion 150 may be configured such that the first region corresponding to the channel and the second region having relatively high electrical conductivity are alternately and repeatedly arranged. In this case, relatively short channels may be connected to each other in series, so that hysteresis of the first driving transistor TR1_1 may be reduced.

In still other embodiments, the first end of the bent portion 150 and the source region 172 of the straight portion 170 may be integrally formed, and the second end of the bent portion 150 and the drain region 173 of the straight portion 170 may be integrally formed. In this case, the bent portion 150 may have only one bent shape, and the bent portion 150 may include one recess.

Figure 19:
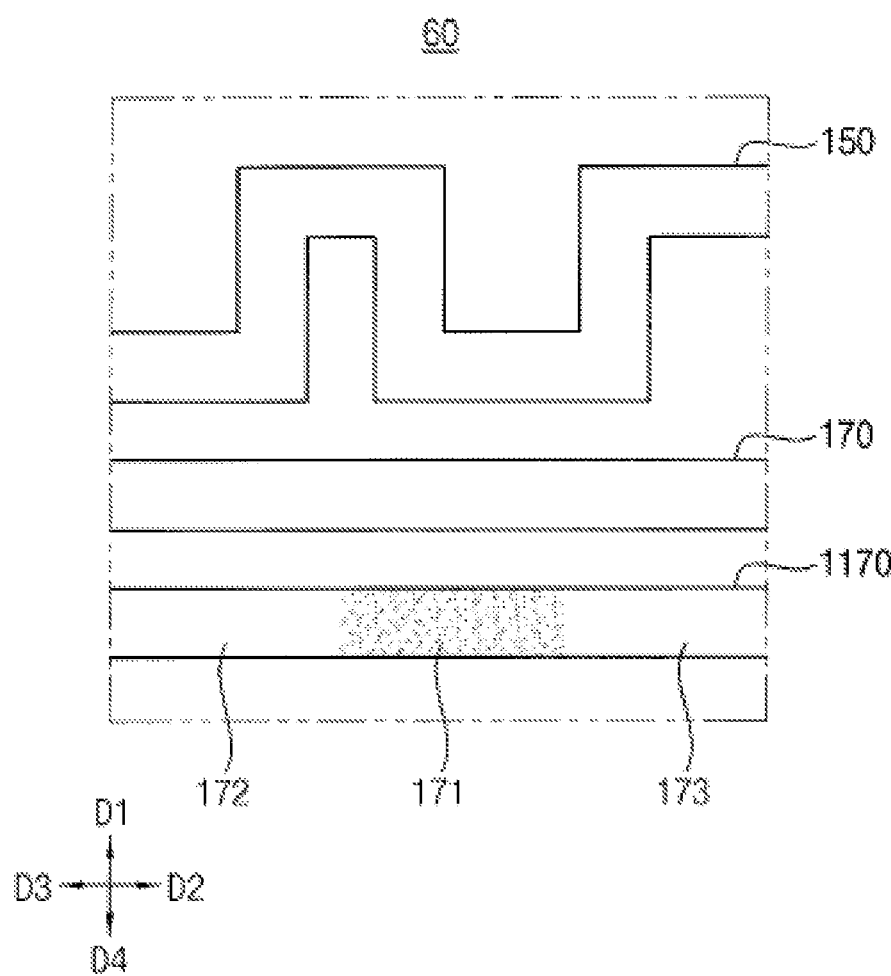
FIG. 19 is a layout view showing still another example of the active pattern included in the organic light emitting display device according to the embodiments.

FIG. 19 is a layout view showing still another example of the active pattern included in the organic light emitting display device according to the embodiments. For example, FIG. 19 may correspond to a layout view for describing the active pattern located in the driving transistor region of FIG. 4. An organic light emitting display device illustrated in FIG. 19 may have a configuration substantially identical or similar to the configuration of the organic light emitting display device 500 described with reference to FIGS. 1 to 11 except for the shape of the active pattern 100. In FIG. 19, redundant descriptions of components that are substantially identical or similar to the components described with reference to FIGS. 1 to 11 will be omitted.

Referring to FIG. 19, the active pattern 100 may include a bent portion 150, a first straight portion 170, and a second straight portion 1170 that are located in the driving transistor region 60. In addition, the first gate electrode 105 may be located in the driving transistor region 60, and the bent portion 150, the first straight portion 170, and the second straight portion 1170 may constitute three driving transistors, which are connected to each other in parallel, together with the first gate electrode 105. For example, the first gate electrode 105 and the bent portion 150 may be defined as a first driving transistor TR1_1, the first gate electrode 105 and the first straight portion 170 may be defined as a second driving transistor TR1_2, and the first gate electrode 105 and the second straight portion 1170 may be defined as a third driving transistor TR1_3.

In the embodiments, the first straight portion 170 may be entirely doped with phosphorus (P), and at least a part of the second straight portion 1170 may be doped with phosphorus (P). In other words, the second straight portion 1170 may have a channel region 171 and source and drain regions 172 and 173 surrounding the channel region 171, the channel region 171 of the second straight portion 1170 of the third driving transistor TR1_3 may be doped with phosphorus (P), and the ion doping may be performed on the source and drain regions 172 and 173 so that the source and drain regions 172 and 173 may have relatively high electrical conductivity. In other words, a length of a channel of the third driving transistor TR1_3 may be shorter than a length of a channel of the second driving transistor TR1_2.

Because the organic light emitting display device includes at least three driving transistors that are connected to each other in parallel, a driving range of the driving transistors may be gradually changed at an inflection point (e.g., a boundary between a low gray level and a high gray level). In other words, the first, second, and third driving transistors TR1_1, TR1_2, and TR1_3 may be included in an organic light emitting display device that uses a low gray level, an intermediate gray level, and a high gray level.

In the foregoing, the description has been made with reference to embodiments of the present invention, but those of ordinary skill in the relevant technical field, the present invention within the scope not departing from the spirit and scope of the present invention described in the following claims. It will be understood that various modifications and changes can be made.

ABILITY OF INDUSTRIAL UTILITY

The present invention may be applied to various electronic devices including an organic light emitting display device. For example, the present invention may be applied to numerous display devices such as a vehicle-display device, a ship-display device, an aircraft-display device, portable communication devices, display devices for display or for information transfer, a medical-display device, etc.

THE DESCRIPTION OF THE REFERENCE NUMERALS 10, 20, 30: first to third sub-pixel circuit regions
40: pixel circuit region 50: substrate
60: driving transistor region
100: active pattern
105: first gate electrode
110: first gate wire
115: second gate wire
120: third gate wire
130: second gate electrode
140: initialization voltage wire
150: bent portion
155_1: first recess
155_2: second recess
156_1: first protrusion portion
156_2: second protrusion portion
157_1: third protrusion portion
157_2: fourth protrusion portion
158, 159: first and second extension portions
190: first interlayer insulating layer
160: gate insulating layer
170: straight portion
191: data wire
230: first connection pattern
270: planarization layer
290: high power supply voltage wire
291: lower electrode
310: pixel defining layer
330: light emitting layer
340: upper electrode
388: second connection pattern
390: third connection pattern
450: encapsulation substrate
500: organic light emitting display device

The invention claimed is:

1. An organic light emitting display device comprising:
a substrate having a sub-pixel circuit region including a driving transistor region;
an active pattern in the sub-pixel circuit region on the substrate, and including a bent portion having a first length in the driving transistor region, and
a straight portion adjacent to the bent portion in the driving transistor region and having a second length shorter than the first length in the driving transistor region;
a gate electrode in the driving transistor region on the substrate, the gate electrode formed as a continuous layer that overlaps the bent portion in a plan view to form a first driving transistor and overlaps the straight portion in a plan view to form a second driving transistor; and
a sub-pixel structure on the active pattern.

2. The organic light emitting display device of claim 1, further comprising:
the first and second driving transistors in the driving transistor region on the substrate, and connected to each other in parallel,
wherein the first driving transistor comprises the gate electrode and the bent portion of the active pattern, and
the second driving transistor comprises the gate electrode and the straight portion of the active pattern.

3. The organic light emitting display device of claim 2, wherein the bent portion of the active pattern corresponds to a channel of the first driving transistor, and
the straight portion of the active pattern corresponds to a channel of the second driving transistor.

4. The organic light emitting display device of claim 1, wherein the active pattern includes poly silicon.

5. The organic light emitting display device of claim 1, wherein the straight portion is doped with phosphorous (P) or boron (B).

6. The organic light emitting display device of claim 1, wherein the straight portion includes source and drain regions and a channel region located between the source and drain regions, and
the channel region of the straight portion is doped with phosphorus (P) or boron (B).

7. The organic light emitting display device of claim 1, further comprising:
a second straight portion spaced apart from the straight portion in the driving transistor region,
wherein the straight portion is entirely doped with phosphorus (P) or boron (B); and
the second straight portion is at least partially doped with the phosphorus (P) or the boron (B), and
the gate electrode overlaps the second straight portion in a plan view to form a third driving transistor.

8. The organic light emitting display device of claim 7, wherein the first, second, and third driving transistors in the driving transistor region on the substrate, and connected to each other in parallel,
the first driving transistor comprises the gate electrode and the bent portion of the active pattern,
the second driving transistor comprises the gate electrode and the straight portion of the active pattern, and
the third driving transistor comprises the gate electrode and the second straight portion of the active pattern.

9. The organic light emitting display device of claim 8, wherein the bent portion of the active pattern corresponds to a channel of the first driving transistor,
the straight portion of the active pattern corresponds to a channel of the second driving transistor, and
the doped portion of the second straight portion of the active pattern corresponds to a channel of the third driving transistor.

10. The organic light emitting display device of claim 9, wherein a length of the channel of the third driving transistor is shorter than a length of the channel of the second driving transistor.

11. The organic light emitting display device of claim 1, wherein at least one recess is formed in a planar direction by the bent portion.

12. The organic light emitting display device of claim 1, wherein the sub-pixel circuit region further includes a switching transistor region surrounding the driving transistor region.

13. The organic light emitting display device of claim 12, wherein the active pattern further includes:
a first extension portion in the switching transistor region on the substrate, spaced apart from the bent portion and the straight portion, and extending in a first direction;
a first protrusion portion protruding from the first extension portion in a second direction orthogonal to the first direction, and connected to a first end of the bent portion; and
a second protrusion portion spaced apart from the first protrusion portion, protruding from the first extension portion in the second direction, and connected to a first end of the straight portion, and
wherein the first extension portion, the first protrusion portion, the second protrusion portion, the first end of the bent portion, and the first end of the straight portion are integrally formed.

14. The organic light emitting display device of claim 13, wherein the active pattern further includes:

a second extension portion spaced apart from the bent portion and the straight portion in the second direction in the switching transistor region, and extending in the first direction;

a third protrusion portion protruding from the second extension portion in a third direction opposite to the second direction, and connected to a second end of the bent portion opposite to the first end of the bent portion; and a fourth protrusion portion spaced apart from the third protrusion portion, protruding from the second extension portion in the third direction, and connected to a second end of the straight portion opposite to the first end of the straight portion, and wherein the second extension portion, the third protrusion portion, the fourth protrusion portion, the second end of the bent portion, and the second end of the straight portion are integrally formed.

15. The organic light emitting display device of claim 12, wherein the active pattern further includes:

a first extension portion in the switching transistor region on the substrate, spaced apart from the bent portion and the straight portion, and extending in a first direction; and a first protrusion portion protruding from the first extension portion in a second direction orthogonal to the first direction, and connected to a first end of the bent portion and a first end of the straight portion, and wherein the first extension portion, the first protrusion portion, the first end of the bent portion, and the first end of the straight portion are integrally formed.

16. The organic light emitting display device of claim 15, wherein the active pattern further includes:

a second extension portion spaced apart from the bent portion and the straight portion in the second direction in the switching transistor region, and extending in the first direction;

a second protrusion portion protruding from the second extension portion in a third direction opposite to the second direction, and connected to a second end of the bent portion opposite to the first end of the bent portion; and a third protrusion portion spaced apart from the second protrusion portion, protruding from the second extension portion in the third direction, and connected to a second end of the straight portion opposite to the first end of the straight portion, and wherein the second extension portion, the second protrusion portion, the third protrusion portion, the second end of the bent portion, and the second end of the straight portion are integrally formed.

17. The organic light emitting display device of claim 12, further comprising a first gate wire in the switching transistor region on the substrate, and extending in a second direction on a first extension portion and a second extension portion of the active pattern.

18. The organic light emitting display device of claim 17, wherein a first switching transistor is configured at a portion where the first gate wire intersects the first extension portion, and a second switching transistor is configured at a portion where the first gate wire intersects the second extension portion.

19. The organic light emitting display device of claim 1, wherein the sub-pixel structure includes:

a lower electrode on the active pattern;
a light emitting layer on the lower electrode; and
an upper electrode on the light emitting layer.

* * * * *